US012604691B2

(12) United States Patent
Dahal

(10) Patent No.: US 12,604,691 B2
(45) Date of Patent: Apr. 14, 2026

(54) METHODS FOR WET ATOMIC LAYER ETCHING OF MOLYBDENUM IN AQUEOUS SOLUTION

(71) Applicant: Tokyo Electron Limited, Tokyo (JP)

(72) Inventor: Tulashi Dahal, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 235 days.

(21) Appl. No.: 18/636,818

(22) Filed: Apr. 16, 2024

(65) Prior Publication Data

US 2025/0323057 A1     Oct. 16, 2025

Related U.S. Application Data

(63) Continuation-in-part of application No. 18/240,142, filed on Aug. 30, 2023, now Pat. No. 12,463,050.

(51) Int. Cl.
H10P 50/66          (2026.01)

(52) U.S. Cl.
CPC .................................. H10P 50/667 (2026.01)

(58) Field of Classification Search
CPC ............... H10P 50/667; H10P 14/6314; H10P 14/6939; H10P 50/283
(Continued)

(56) References Cited

U.S. PATENT DOCUMENTS 8,961,814 B2    2/2015  Van Duren et al.
9,365,770 B2    6/2016  Okabe et al.
(Continued)

FOREIGN PATENT DOCUMENTS

CN       108206070       6/2018
WO       2017099718      6/2017
WO       2023239495      12/2023

OTHER PUBLICATIONS

Natarajan et al., "Mechanism Of Thermal Atomic Layer Etch Of W Metal Using Sequential Oxidation And Chlorination: A First-Principles Study", Applied Materials & Interfaces, ACS Appl. Mater. Interfaces, 2020, 11 pgs.
(Continued)

*Primary Examiner* — Duy Vu N Deo
(74) *Attorney, Agent, or Firm* — Egan, Enders & Huston LLP.

(57)          ABSTRACT

Methods are provided for etching molybdenum in a wet ALE process. The methods disclosed herein use a wide variety of techniques and wet etch chemistries to oxidize a molybdenum surface and form a self-limiting, molybdenum oxide passivation layer in a surface modification step of the wet ALE process. In the wet ALE processes and methods disclosed herein, self-limiting behavior is provided in the oxidation step by adding a polydentate ligand to an aqueous oxidizing solution. The polydentate ligand reacts with and binds to the oxidized molybdenum surface to form a stable, ligand-molybdenum oxide complex, which is insoluble within the aqueous oxidizing solution. The insolubility of the ligand-molybdenum complex in the aqueous oxidizing solution provides self-limiting behavior in the oxidation step. After forming the molybdenum oxide passivation layer, the passivation layer is selectively removed in a dissolution step of the wet ALE process to etch the molybdenum surface.

24 Claims, 16 Drawing Sheets

(58) Field of Classification Search
USPC ................................................ 438/745, 754
See application file for complete search history.

(56) References Cited

U.S. PATENT DOCUMENTS

| | | | |
|---|---|---|---|
| 9,768,327 | B2 | 9/2017 | Woehl et al. |
| 10,096,487 | B2 | 10/2018 | Yang et al. |
| 10,982,335 | B2 | 4/2021 | Abel |
| 2005/0233578 | A1 | 10/2005 | Jia et al. |
| 2017/0053810 | A1 | 2/2017 | Yang et al. |
| 2018/0040486 | A1 | 2/2018 | Anthis et al. |
| 2019/0198392 | A1 | 6/2019 | Mullick et al. |
| 2020/0118835 | A1 | 4/2020 | Kanarik |
| 2020/0161148 | A1 | 5/2020 | Abel |
| 2020/0286743 | A1 | 9/2020 | Lai et al. |
| 2020/0312620 | A1 | 10/2020 | Blomberg et al. |
| 2022/0139717 | A1* | 5/2022 | Sreenivasan .......... H10P 50/644 |
| | | | 438/745 |
| 2022/0148882 | A1* | 5/2022 | Abel .................... H10P 50/264 |
| 2022/0148885 | A1* | 5/2022 | Abel ........................ C23F 1/08 |
| 2022/0365434 | A1 | 11/2022 | Nardi et al. |
| 2023/0117790 | A1* | 4/2023 | Abel .................... H10P 50/283 |
| | | | 438/758 |
| 2023/0118554 | A1 | 4/2023 | Abel |
| 2023/0121246 | A1 | 4/2023 | Abel |
| 2023/0140900 | A1 | 5/2023 | Netzband et al. |
| 2024/0327983 | A1 | 10/2024 | Leoncini |
| 2025/0323057 | A1* | 10/2025 | Dahal ................... H10P 50/667 |

OTHER PUBLICATIONS

Fang et al., "Thermal Atomic Layer Etching: Mechanism, Materials And Prospects", ScienceDirect, National Laboratory Of Solid State Microstructures, 2018, 9 pgs.

Xie et al., "Thermal Atomic Layer Etching Of Metallic Tungsten Via Oxidation And Etch Reaction Mechanism Using O2 or O3 For Oxidation And WCI6 As The Chlorinating Etchant", Journal Of Vacuum Science Technology A, Obtained from Internet Feb. 2024, 40 pgs.

Xie et al., "Thermally Driven Self-Limiting Atomic Layer Etching Of Metallic Tungsten Using WF6 and 02", Applied Materials & Interfaces, ACS Appl. Mater. Interfaces, 2018, 8 pgs.

Johnson et al., "WO3 And W Thermal Atomic Layer Etching Using "Conversion-Fluorination" And "Oxidation-Conversion-Flurorination" Mechanisms", Applied Materials & Interfaces, American Chemical Society, 2017, 13 pgs.

You et al., "Atomic Layer Etching Of Tungsten DIsulfide Using Remote Plasma-Induced Oxidation And Wet Etching", The Electrochemical Society J Solid State Sci. Technology, 2023, 7 pgs.

Dahal et al., Methods For Wet Atomic Layer Etching Of Molybdenum, U.S. Appl. No. 18/240,142, filed Aug. 30, 2023, 72 pgs.

Dahal et al., Methods For Wet Atomic Layer Etching Of Tungsten, U.S. Appl. No. 18/619,491, filed Mar. 28, 2024, 67 pgs.

"Notification Of Transmittal Of The International Search Report And The Written Opinion Of The International Searching Authority, Or The Declaration", PCT/US2025/017362, International Filing Date Feb. 26, 2025; 10 pgs., Jun. 11, 2025.

Pacco et al., "Etching Of Molybdenum Via A Combination Of Low-Temperature Ozone Oxidation And Wet-Chemical Oxide Dissolution", Journal Of Vacuum Science & Amp, Technology A, No. 3, See Abstract, 2023, 6 pgs.

* cited by examiner

Figure 1:
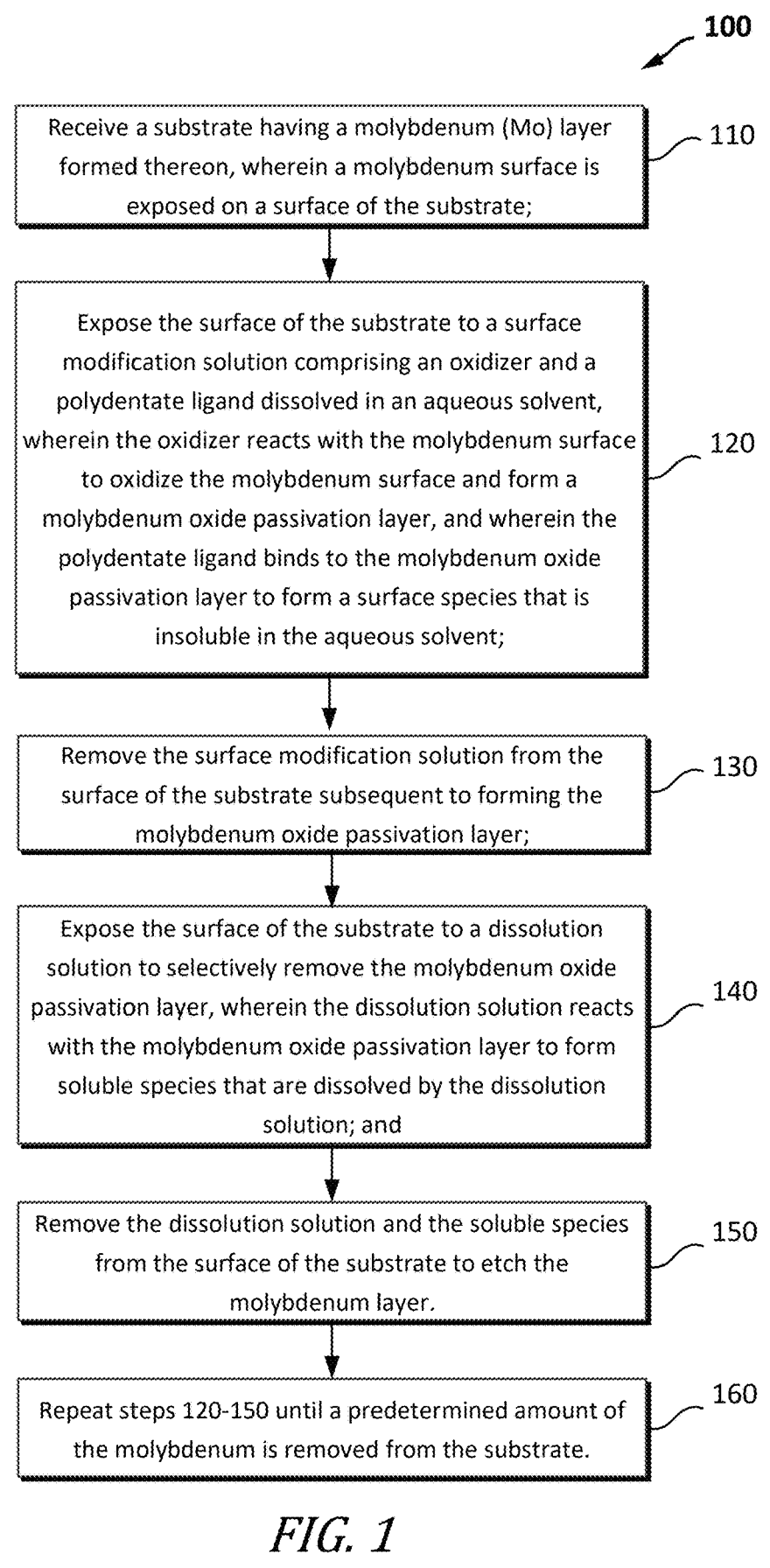

100

```
┌─────────────────────────────────────────┐
│  Receive a substrate having a molybdenum  │      110
│  (Mo) layer formed thereon, wherein a     │
│  molybdenum surface is exposed on a       │
│  surface of the substrate;                │
└─────────────────────────────────────────┘
                    │
                    ▼
┌─────────────────────────────────────────┐
│  Expose the surface of the substrate to   │
│  a surface modification solution          │
│  comprising an oxidizer and a             │
│  polydentate ligand dissolved in an       │
│  aqueous solvent, wherein the oxidizer    │      120
│  reacts with the molybdenum surface       │
│  to oxidize the molybdenum surface and    │
│  form a molybdenum oxide passivation      │
│  layer, and wherein the polydentate       │
│  ligand binds to the molybdenum oxide     │
│  passivation layer to form a surface      │
│  species that is insoluble in the         │
│  aqueous solvent;                         │
└─────────────────────────────────────────┘
                    │
                    ▼
┌─────────────────────────────────────────┐
│  Remove the surface modification solution │      130
│  from the surface of the substrate        │
│  subsequent to forming the molybdenum     │
│  oxide passivation layer;                 │
└─────────────────────────────────────────┘
                    │
                    ▼
┌─────────────────────────────────────────┐
│  Expose the surface of the substrate to a │
│  dissolution solution to selectively      │
│  remove the molybdenum oxide passivation  │
│  layer, wherein the dissolution solution  │      140
│  reacts with the molybdenum oxide         │
│  passivation layer to form soluble        │
│  species that are dissolved by the        │
│  dissolution solution; and                │
└─────────────────────────────────────────┘
                    │
                    ▼
┌─────────────────────────────────────────┐
│  Remove the dissolution solution and the  │      150
│  soluble species from the surface of the  │
│  substrate to etch the molybdenum layer.  │
└─────────────────────────────────────────┘
                    │
                    ▼
┌─────────────────────────────────────────┐
│  Repeat steps 120-150 until a             │      160
│  predetermined amount of the molybdenum   │
│  is removed from the substrate.           │
└─────────────────────────────────────────┘
```

Figure 15:
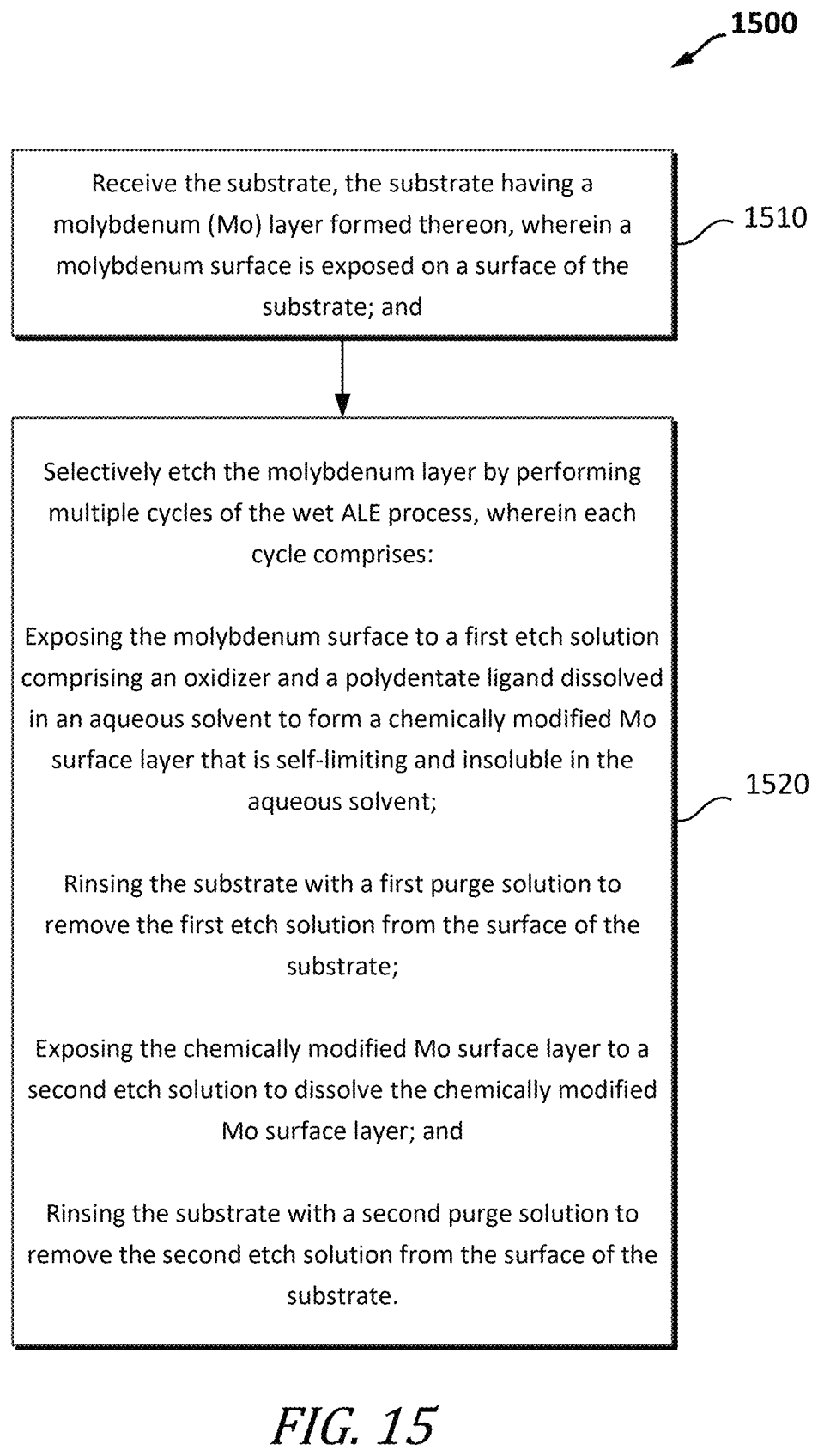

Receive the substrate, the substrate having a molybdenum (Mo) layer formed thereon, wherein a molybdenum surface is exposed on a surface of the substrate; and

1510

Selectively etch the molybdenum layer by performing multiple cycles of the wet ALE process, wherein each cycle comprises:

Exposing the molybdenum surface to a first etch solution comprising an oxidizer and a polydentate ligand dissolved in an aqueous solvent to form a chemically modified Mo surface layer that is self-limiting and insoluble in the aqueous solvent;

Rinsing the substrate with a first purge solution to remove the first etch solution from the surface of the substrate;

Exposing the chemically modified Mo surface layer to a second etch solution to dissolve the chemically modified Mo surface layer; and Rinsing the substrate with a second purge solution to remove the second etch solution from the surface of the substrate.

METHODS FOR WET ATOMIC LAYER ETCHING OF MOLYBDENUM IN AQUEOUS SOLUTION

RELATED APPLICATIONS

This application is a continuation-in-part (CIP) of co-pending U.S. patent application Ser. No. 18/240,142, entitled "Methods for Wet Atomic Layer Etching of Molybdenum," filed Aug. 30, 2023; the entirety of which is incorporated herein by reference. This application is related to U.S. patent application Ser. No. 18/619,491, entitled "Methods for Wet Atomic Layer Etching of Tungsten," filed Mar. 28, 2024; the entirety of which is incorporated herein by reference.

BACKGROUND

This disclosure relates to semiconductor device manufacturing, and, in particular, to the removal and etching of polycrystalline materials, such as transition metals.

During routine semiconductor fabrication, various metals formed on a substrate may be removed by patterned etching, chemical-mechanical polishing, as well as other techniques. A variety of techniques are known for etching layers on a substrate, including plasma-based etching (otherwise referred to as dry etching) and liquid-based etching (otherwise referred to as wet etching). Wet etching generally involves dispensing a chemical solution over the surface of a substrate or immersing the substrate in the chemical solution. The chemical solution often contains a solvent, chemicals designed to react with materials on the substrate surface and chemicals to promote dissolution of the reaction products. As a result of exposure of the substrate surface to the etchant, material is removed from the substrate. Etchant composition and temperature may be controlled to control the etch rate, specificity and residual material on the surface of the substrate post-etch.

Thermodynamics and kinetics both play roles in etchant formulation. The desired reactions need to be both thermodynamically and kinetically favorable for a successful etch. The requirements for success become much more stringent for etching polycrystalline materials. For these materials, it is desirable that the removal rates for each individual crystallite facet and grain boundary geometry is substantially similar regardless of crystallite morphology or environment. Surface roughness plays an important role in interface quality and electrical properties of nanoscale features. When etching nanoscale polycrystalline materials, differing etch rates at grain boundaries compared to the different crystal facets leads to roughening of the surface during etching. Further, it is desirable that the material removal rate should be uniform at the macroscopic and microscopic levels and occurs at a rate that is compatible with high volume manufacturing. Macroscopic uniformity can be addressed with careful engineering, but microscopic uniformity depends on the chemistry of the etch itself.

As geometries of substrate structures continue to shrink and the types of structures evolve, the challenges of etching substrates have increased. One technique that has been utilized to address these challenges is atomic layer etching (ALE). ALE is a process that removes thin layers sequentially through one or more self-limiting reactions. For example, ALE typically refers to techniques that can etch with atomic precision, i.e., by removing material one monolayer (or a few monolayers) of material at a time. ALE processes generally rely on a chemical modification of the surface to be etched followed by a selective removal of the modified layer. Thus, ALE processes offer improved performance by decoupling the etch process into sequential steps of surface modification and removal of the modified surface. In some embodiments, an ALE process may include multiple cyclic series of layer modification and etch steps, where the modification step modifies the exposed surfaces and the etch step selectively removes the modified layer. In such processes, a series of self-limiting reactions may occur and the cycle may be repeatedly performed until a desired or specified etch amount is achieved. In other embodiments, an ALE process may use just one cycle.

A variety of ALE processes are known, including plasma ALE, thermal ALE and wet ALE techniques. Like all ALE processes, wet ALE is typically a cyclic process that uses sequential, self-limiting reactions to selectively remove material from the surface. Unlike thermal and plasma ALE, however, the reactions used in wet ALE primarily take place in the liquid phase. Compared to other ALE processes, wet ALE is often desirable since it can be conducted at (or near) room temperature and atmospheric pressure. Additionally, the self-limiting nature of the wet ALE process leads to smoothing of the surface during etching rather than the roughening commonly seen during other etch processes.

A wet ALE process typically begins with a surface modification step, which exposes a material to a first solution to create a self-limiting modified surface layer. Ideally, the modified surface layer is confined to the top monolayer of the material and acts as a passivation layer to prevent the modification reaction from progressing any further. After the modified surface layer is formed, the wet ALE process may expose the modified surface layer to a second solution to selectively dissolve the modified surface layer in a subsequent dissolution step. The dissolution step must selectively dissolve the modified surface layer without removing any of the underlying unmodified material. This selectivity can be accomplished by using a different solvent in the dissolution step than was used in the surface modification step, changing the pH, or changing the concentration of other components in the first solvent. The wet ALE cycle can be repeated until a desired or specified etch amount is achieved.

Recently, molybdenum (Mo) is being considered as a metal for middle of line metallization, memory applications and new integration schemes, such as buried power rails. Many of these applications require etch back operations where the surface morphology of the post-etch surface is critical to device performance. However, the polycrystalline nature of molybdenum makes it susceptible to pitting if an etchant reacts at the grain boundaries with faster kinetics than the grain surface. Etchant chemistry should, at a minimum, leave the surface no rougher than it was initially, and ideally, improve the surface roughness during etching. Unfortunately, wet etch chemistries traditionally used for etching molybdenum result in a rough post-etch surface. Accordingly, new wet etch chemistries are needed for etching molybdenum.

SUMMARY

The present disclosure provides improved wet etch processes and methods for etching polycrystalline materials. More specifically, the present disclosure provides various embodiments of wet etch processes and methods that utilize new etch chemistries for etching transition metals, such as molybdenum (Mo), in a wet etch process.

As described in more detail below, the embodiments disclosed herein expose a transition metal surface to a first etch solution to chemically modify the transition metal surface and form a modified surface layer (otherwise referred to herein as a passivation layer), which can be selectively dissolved in a second etch solution to etch the transition metal surface. The first etch solution may generally include an oxidizer and a ligand dissolved in an aqueous solvent. The oxidizer included within the first etch solution reacts with the transition metal surface to oxidize the transition metal surface and form a transition metal oxide passivation layer. The ligand reacts with and binds to the transition metal passivation layer to change the surface chemistry of the transition metal passivation layer, thereby ensuring that the transition metal passivation layer is self-limiting and insoluble in the aqueous solvent.

A wide variety of techniques and etch chemistries are disclosed herein for oxidizing an exposed surface of a transition metal (such as, e.g., molybdenum, Mo) and forming a self-limiting transition metal oxide passivation layer (such as, e.g., $MoO_3$) on the underlying transition metal (e.g., metallic Mo). In the embodiments disclosed, ligand-assisted oxidation is used to change the surface chemistry of the transition metal oxide passivation layer and ensure self-limiting oxidation behavior. After forming the self-limiting transition metal oxide passivation layer, a second etch solution may be dispensed onto the surface of the substrate to selectively dissolve the transition metal oxide passivation layer, thus removing the transition metal oxide passivation layer from the substrate surface without etching the underlying transition metal (e.g., metallic Mo). Several etch chemistries can be used to selectively dissolve molybdenum oxides (such as, e.g., $MoO_3$) without dissolving metallic Mo, as described in more detail below.

According to one embodiment, a method is provided herein for etching a substrate having a molybdenum layer formed thereon. In some embodiments, the method may begin by receiving a substrate having a molybdenum (Mo) layer formed thereon, where a molybdenum surface is exposed on a surface of the substrate, and exposing the surface of the substrate to a surface modification solution comprising an oxidizer and a polydentate ligand dissolved in an aqueous solvent. The oxidizer reacts with the molybdenum surface to oxidize the molybdenum surface and form a molybdenum oxide passivation layer. The polydentate ligand binds to the molybdenum oxide passivation layer to form a surface species that is insoluble in the aqueous solvent. The method further includes removing the surface modification solution from the surface of the substrate subsequent to forming the molybdenum oxide passivation layer, and exposing the surface of the substrate to a dissolution solution to selectively remove the molybdenum oxide passivation layer. The dissolution solution reacts with the molybdenum oxide passivation layer to form soluble species that are dissolved by the dissolution solution. The method further includes removing the dissolution solution and the soluble species from the surface of the substrate to etch the molybdenum layer. In some embodiments, the steps of exposing the surface of the substrate to the surface modification solution, removing the surface modification solution, exposing the surface of the substrate to the dissolution solution, and removing the dissolution solution and the soluble species may be repeated a number of times until a predetermined amount of the molybdenum layer is removed from the substrate.

In the method disclosed above, ligand-assisted oxidation is used to change the surface chemistry of the molybdenum oxide passivation layer and provide self-limiting oxidation behavior in an aqueous oxidizing solution (i.e., the surface modification solution). As noted above, a polydentate ligand is added to a surface modification solution comprising an oxidizer dissolved in water. The polydentate ligand reacts with and binds to the molybdenum oxide passivation layer to change a surface chemistry of the molybdenum oxide passivation layer, which ensures that the molybdenum oxide passivation layer is self-limiting and insoluble in the aqueous solvent. More specifically, the polydentate ligand reacts with and binds to the molybdenum oxide passivation layer to form a stable, ligand-molybdenum oxide complex (i.e., the surface species) on the surface of the molybdenum oxide passivation layer that is insoluble in the aqueous solvent. The ligand-molybdenum oxide complex suppresses, or substantially prevents, the solubilization of the molybdenum oxide passivation layer within the surface modification solution. In doing so, the addition of a polydentate ligand to the surface modification solution enables a self-limiting, molybdenum oxide passivation layer to be formed in an aqueous oxidizing solution.

A wide variety of peroxide and non-peroxide oxidizers may be utilized within the surface modification solution to oxidize the molybdenum surface and form the molybdenum oxide passivation layer. Examples of non-peroxide oxidizers include, but are not limited to, ammonium persulfate (APS), ferric chloride ($FeCl_3$), osmium tetroxides, ruthenium tetroxides, ruthenates, manganates, permanganates, periodates, and metal nitrates. Examples of peroxide oxidizers include hydrogen peroxide ($H_2O_2$), organic peroxides (such as di-tert-butyl peroxide ($C_8H_{18}O_2$) and tert-butyl peroxybenzoate ($C_{11}H_{14}O_3$)), monoperoxides (such as tert-butyl hydroperoxide ($C_4H_{10}O_2$)), peroxy acids (such as peracetic acid ($C_2H_4O_3$)).

A wide variety of polydentate ligands may be added to the surface modification solution to render the molybdenum oxide passivation layer (e.g., $MoO_3$) at least partially insoluble within the surface modification solution. For example, the polydentate ligand may be a bidentate ligand, a tridentate ligand, a tetradentate ligand, a pentadentate ligand, a hexadentate ligand, etc. Examples of polydentate ligands that may be added to the surface modification solution include, but are not limited to, oxalic acid (bidentate), acetic acid (bidentate), ascorbic acid (bidentate), mandelic acid (bidentate), malic acid (bidentate), maleic acid (bidentate), fumaric acid (bidentate), ethylenediamine (bidentate), acetylacetonate ion (bidentate), diethylenetriamine (tridentate), terpyridine (tridentate), diaminopyridine (tridentate), pentamethyl diethylenetriamine (tridentate), triethylenetetramine (tetradentate), nitrilotriacetate (tetradentate), tetraethylenepentamine (pentadentate), ethylenediaminetetraacetic acid (EDTA, hexadentate) and the diammonium salt of EDTA [$(NH_4)_2$EDTA] (hexadentate).

In some embodiments, the polydentate ligand may have more than two donor atoms to increase a stability of the ligand-metal oxide complex and render the molybdenum oxide passivation layer insoluble in the aqueous solvent. For example, the polydentate ligand may be a tridentate ligand, a tetradentate ligand, a pentadentate ligand or a hexadentate ligand. In some embodiments, the polydentate ligand may be hexadentate ligand, such as but not limited to, ethylenediaminetetraacetic acid (EDTA) and the diammonium salt of EDTA [$(NH_4)_2$EDTA].

In one example embodiment, the surface modification solution may include ammonium persulfate (APS) and the diammonium salt of EDTA [$(NH_4)_2$EDTA] dissolved in deionized water (DIW). APS (the oxidizer) may be included within the surface modification solution to oxidize the molybdenum surface and form a molybdenum trioxide $(MoO_3)$ passivation layer on the underlying molybdenum (e.g., metallic Mo). The diammonium salt of EDTA $[(NH_4)_2EDTA]$ included within the surface modification solution reacts with and binds to the molybdenum trioxide $(MoO_3)$ passivation layer to form a stable, ligand-molybdenum oxide complex on the surface of the molybdenum trioxide $(MoO_3)$ passivation layer that is insoluble in water, thereby forming a self-limiting molybdenum trioxide $(MoO_3)$ passivation layer in aqueous solution. However, other combinations of oxidizers and polydentate ligands may also be utilized within the surface modification solution to provide a self-limiting molybdenum trioxide $(MoO_3)$ passivation layer in aqueous solution.

A wide variety of dissolution solutions may be used in the method embodiments described above. For example, the dissolution solution may be: (a) an aqueous acid solution comprising hydrochloric acid (HCl), nitric acid or sulfuric acid, (b) an aqueous basic solution comprising ammonium hydroxide $(NH_4OH)$, tetramethylammonium hydroxide (TMAH), potassium hydroxide (KOH) or calcium hydroxide $(Ca(OH)_2)$, (c) a non-aqueous ligand solution comprising alpha-benzoin oxime in acetone, dimethyl sulfoxide (DMSO), methyl-ethyl ketone (MEK) or another ketone, or (d) an aqueous ligand solution comprising a base (or an acid) and a ligand.

In one example embodiment, the dissolution solution may be an aqueous ligand solution comprising a base (such as, e.g., ammonium hydroxide, $NH_4OH$) and a ligand to prevent continuous etching of the molybdenum layer during the dissolution step and reduce the post-etch roughness of the molybdenum surface. In some embodiments, the ligand included within the dissolution solution may contain an ascorbate anion. For example, the ligand may be ascorbic acid, sodium ascorbate, calcium ascorbate, potassium ascorbate, oxalic acid, formic acid, acetic acid, ethylenediamine, ethylenediaminetetraacetic acid (EDTA) or iminodiacetic acid.

According to another embodiment, a method is provided herein for etching a substrate using a wet atomic layer etching (ALE) process. In some embodiments, the method may begin by receiving the substrate, the substrate having a molybdenum (Mo) layer formed thereon, wherein a molybdenum surface is exposed on a surface of the substrate. The method further includes selectively etching the molybdenum layer by performing multiple cycles of the wet ALE process, wherein each cycle comprises: (a) exposing the molybdenum surface to a first etch solution comprising an oxidizer and a polydentate ligand in an aqueous solvent to form a chemically modified Mo surface layer that is self-limiting and insoluble in the aqueous solvent; (b) rinsing the substrate with a first purge solution to remove the first etch solution from the surface of the substrate; (c) exposing the chemically modified Mo surface layer to a second etch solution to dissolve the chemically modified Mo surface layer; and (d) rinsing the substrate with a second purge solution to remove the second etch solution from the surface of the substrate.

In the method disclosed above, the oxidizer included within the first etch solution reacts with the molybdenum surface to oxidize the molybdenum surface and form the chemically modified Mo surface layer. The polydentate ligand included within the first etch solution reacts with the chemically modified Mo surface layer to change a surface chemistry of the chemically modified Mo surface layer. Changing the surface chemistry ensures that the chemically modified Mo surface layer is self-limiting and insoluble in the aqueous solvent.

A wide variety of oxidizers and polydentate ligands may be used in the first etch solution. For example, the oxidizer may be a non-peroxide oxidizer such as, but not limited to, ammonium persulfate (APS), ferric chloride $(FeCl_3)$, osmium tetroxides, ruthenium tetroxides, ruthenates, manganates, permanganates, periodates, and metal nitrates. Alternatively, the oxidizer may be a peroxide oxidizer such as, but not limited to, hydrogen peroxide $(H_2O_2)$, an organic peroxide (such as di-tert-butyl peroxide $(C_8H_{18}O_2)$ and tert-butyl peroxybenzoate $(C_{11}H_{14}O_3)$), a monoperoxide (such as tert-butyl hydroperoxide $(C_4H_{10}O_2)$), or a peroxy acid (such as peracetic acid $(C_2H_4O_3)$). The polydentate ligand may be a bidentate ligand, a tridentate ligand, a tetradentate ligand, a pentadentate ligand, or a hexadentate ligand, as noted above.

The second etch solution may include a variety of reactants dissolved in aqueous and non-aqueous solutions. For example, the second etch solution may be: (a) an aqueous acid solution comprising hydrochloric acid (HCl), nitric acid or sulfuric acid, (b) an aqueous basic solution comprising ammonium hydroxide $(NH_4OH)$, tetramethylammonium hydroxide (TMAH), potassium hydroxide (KOH) or calcium hydroxide $(Ca(OH)_2)$, (c) a non-aqueous ligand solution comprising alpha-benzoin oxime in acetone, dimethyl sulfoxide (DMSO), methyl-ethyl ketone (MEK) or another ketone, or (d) an aqueous ligand solution comprising a base and a ligand.

In one example embodiment, the first etch solution may comprise ammonium persulfate (APS) and a hexadentate ligand dissolved in water, and the second etch solution may be an aqueous ligand solution comprising ammonium hydroxide $(NH_4OH)$ and a ligand. The hexadentate ligand included within the first etch solution may be ethylenediaminetetraacetic acid (EDTA) or the diammonium salt of EDTA $[(NH_4)_2EDTA]$. The ligand included within the second etch solution may be ascorbic acid, sodium ascorbate, calcium ascorbate, potassium ascorbate, oxalic acid, formic acid, acetic acid, ethylenediamine, ethylenediaminetetraacetic acid (EDTA) or iminodiacetic acid.

The methods disclosed herein may be used to etch a wide variety of materials, including polycrystalline materials, single-crystalline materials and amorphous materials. In some embodiments, the methods disclosed herein may be used to etch a transition metal. Examples of transition metals that may be etched using the methods disclosed herein include, but are not limited to, molybdenum (Mo), cobalt (Co), copper (Cu), tungsten (W), vanadium (V), niobium (Nb), tantalum (Ta), titanium (Ti), chromium (Cr) and nickel (Ni).

Note that this Summary Section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

BRIEF DESCRIPTION OF THE DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

FIG. 1 is a flowchart diagram illustrating one embodiment of a method that utilizes the techniques disclosed herein for etching a substrate using a cyclic wet atomic layer etching (ALE) process.

FIG. 2 illustrates one example of a cyclic wet ALE process that can be used to etch a transition metal surface, such as a molybdenum surface, in accordance with one embodiment of the present disclosure.

Figure 2:
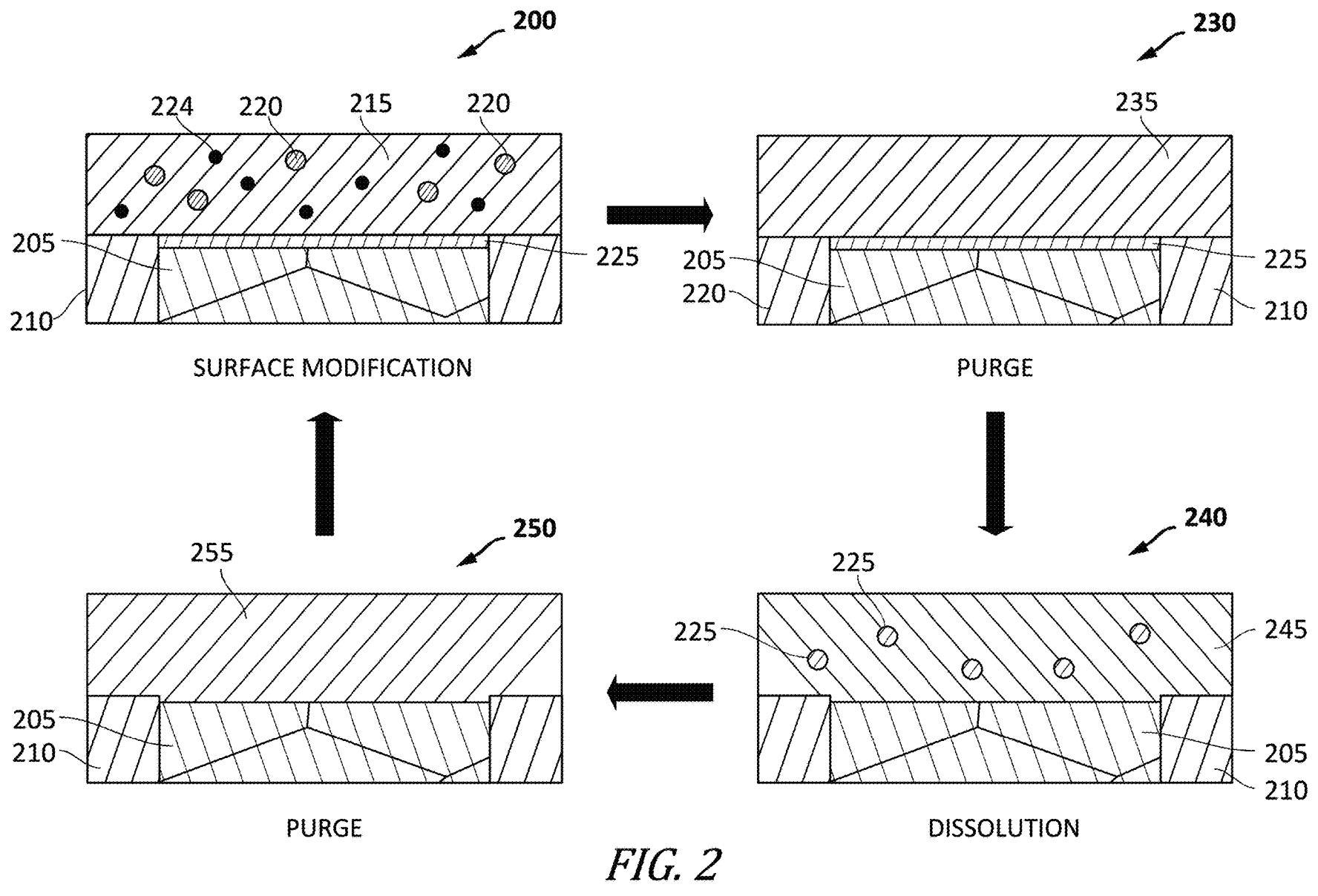

10 mM AA solution to selectively remove the molybdenum oxide passivation layer in the wet ALE process shown in FIG. 2.

Figure 13:
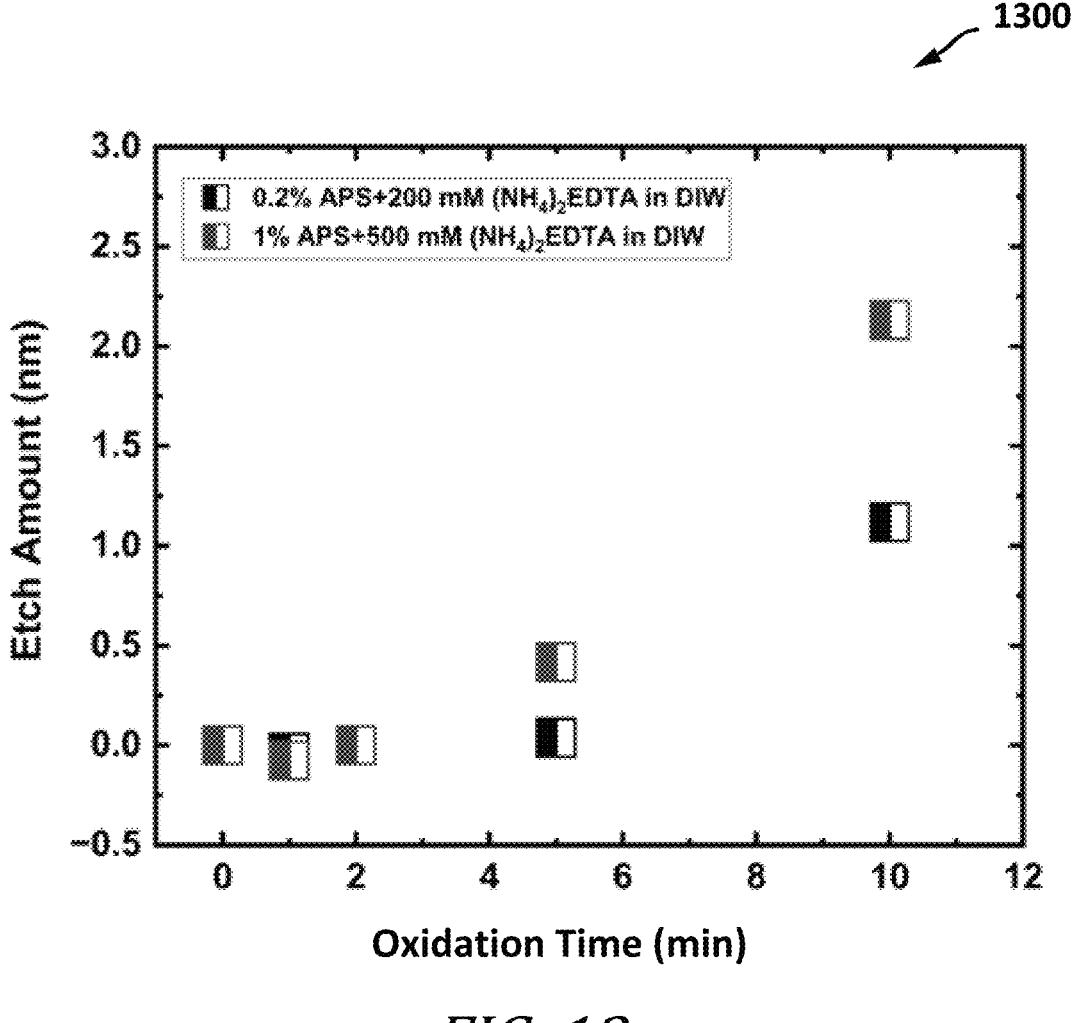

FIG. 13 is a graph depicting exemplary etch amounts (expressed in nanometers, nm) achieved as a function of oxidation time (expressed in minutes, min) when using two different aqueous oxidizing solutions containing various concentrations of APS and $(NH_4)_2EDTA$ in DIW.

Figure 14:
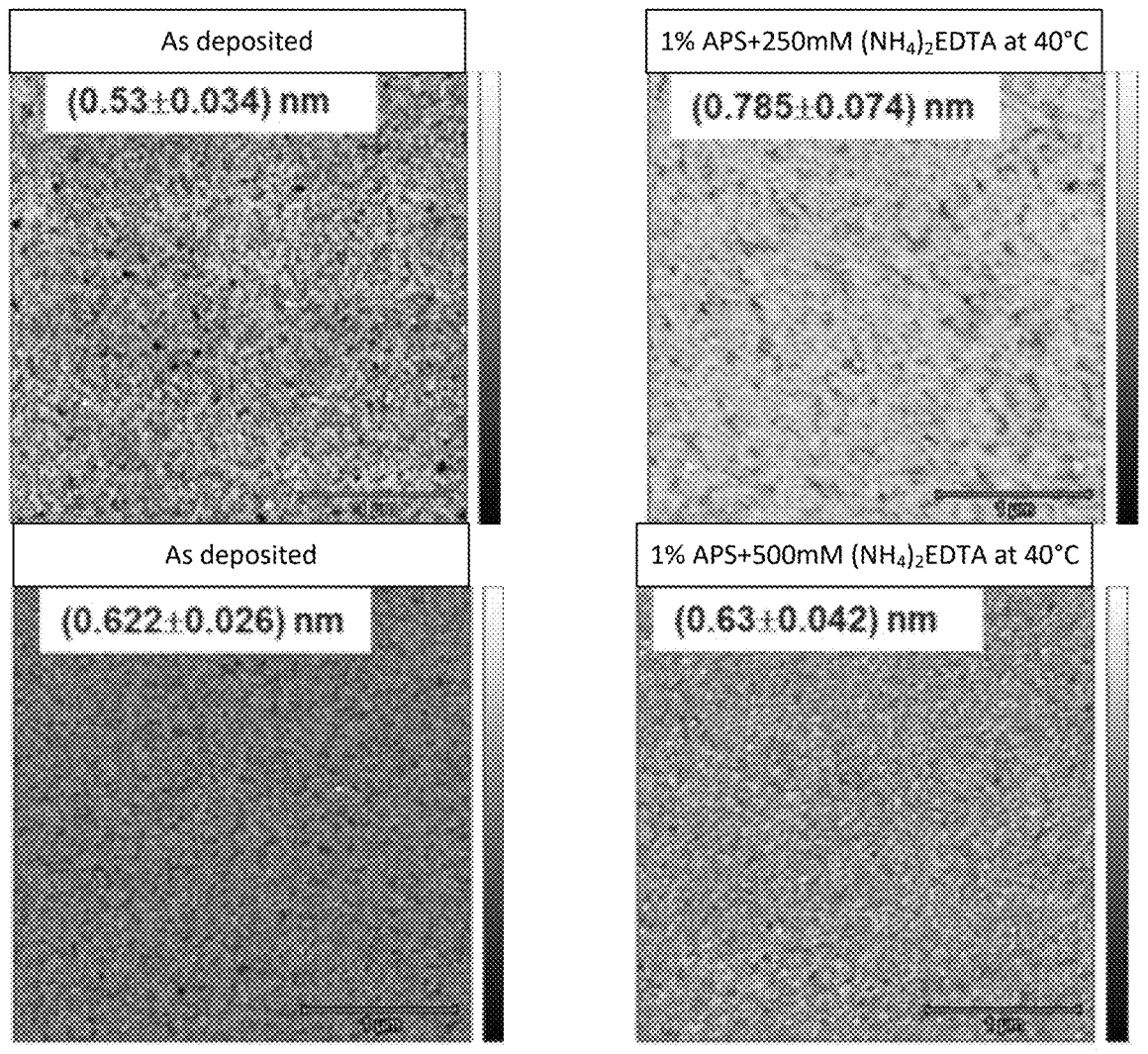

FIG. 14 provides atomic force measurement (AFM) images of as-deposited molybdenum and post-etch molybdenum etched using various concentrations of $(NH_4)_2EDTA$ in a 1% APS-$(NH_4)_2EDTA$-DIW solution.

FIG. 15 is a flowchart diagram illustrating one embodiment of a method that utilizes the ligand-assisted oxidation techniques shown in FIG. 2 for etching a substrate using a wet ALE process.

Figure 16:
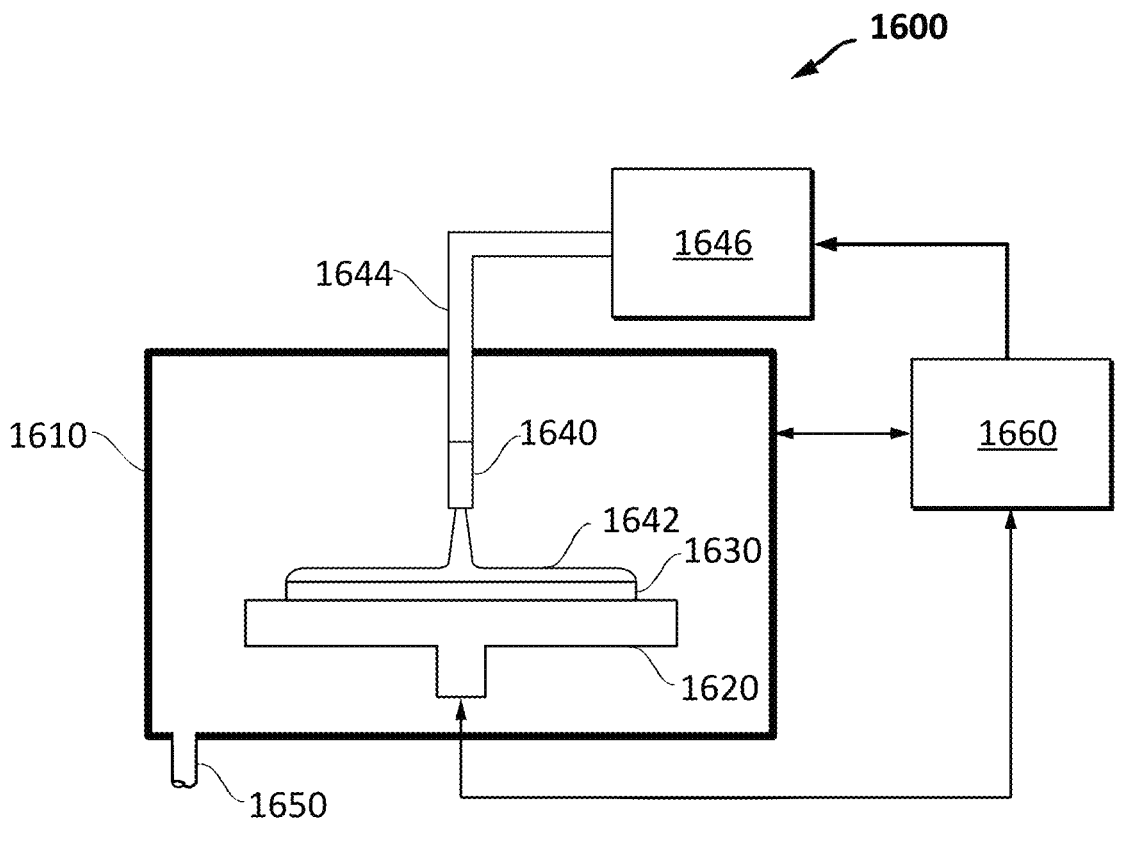

FIG. 16 is a block diagram illustrating one embodiment of a processing system that can be used to etch a transition metal surface, such as a molybdenum surface, using the wet ALE processes disclosed herein.

DETAILED DESCRIPTION

Wet ALE processes can be used to etch transition metals formed on a substrate by performing one or more cycles of the wet ALE process, where each cycle includes a surface modification step and a dissolution step. In the surface modification step, an exposed surface of the transition metal is exposed to a surface modification solution containing an oxidizer to chemically modify the exposed surface of the transition metal and form a modified surface layer (e.g., a transition metal oxide passivation layer). In the dissolution step, the modified surface layer is selectively removed by exposing the modified surface layer to a dissolution solution to dissolve the modified surface layer. Purge steps may be performed between the surface modification and dissolution steps to prevent the surface modification and dissolution solutions from mixing, and the process may be repeated in a cyclic manner until a desired amount of etching is achieved. In order to achieve atomic layer etching, however, at least one of the surface modification and dissolutions steps must be self-limiting.

A variety of transition metals may be etched using wet ALE processes, including cobalt (Co), ruthenium (Ru), copper (Cu), gold (Au), platinum (Pt), Iridium (Ir), molybdenum (Mo), tungsten (W), etc. Wet ALE processes for etching such transition metals are disclosed in U.S. Pat. No. 10,982,335, entitled "Wet Atomic Layer Etching Using Self-Limiting and Solubility-limited Reactions," U.S. Patent Application Publication No. 2023/0118554, entitled "Methods for Wet Atomic Layer Etching of Ruthenium," U.S. Patent Application Publication No. 2023/0140900, entitled "Methods for Wet Atomic Layer Etching of Copper," U.S. Patent Application Publication No. 2023/0121246, "Methods for Wet Atomic Layer Etching of Noble Metals," U.S. patent application Ser. No. 18/240,142, entitled "Methods for Wet Atomic Layer Etching of Molybdenum," and U.S. patent application Ser. No. 18/619,491, entitled "Methods for Wet Atomic Layer Etching of Tungsten," each of which is incorporated herein by reference.

Molybdenum (Mo) is a transition metal commonly used in semiconductor manufacturing. However, developing wet ALE chemistries for etching molybdenum is difficult because many surface reactions do not lead to self-limiting behavior. For example, although molybdenum trioxide ($MoO_3$) is easily formed as a modified surface layer, it is difficult to form in a self-limiting manner using wet chemistries. This difficulty arises because of the solubility of $MoO_3$ in both aqueous and non-aqueous oxidizing solutions. For example, $MoO_3$ is soluble in aqueous oxidizing solutions. Even when non-aqueous solutions are used, strong oxidizers (such as hydrogen peroxide, $H_2O_2$) can pull molybdenum into solution, leading to oxidation behavior that is not self-limiting. Strong oxidizers also cause preferential grain boundaries attack, leading to a continuous etch of the molybdenum surface. Selective dissolution of the modified surface layer is also challenging, due to graded oxide formation. Both of these conditions lead to inconsistent etch amount of the molybdenum surface per ALE cycle (both within wafer and from wafer to wafer) and increased post-etch surface roughness of the molybdenum surface, which negatively impacts resistive-capacitive (RC) time delay in the integrated circuit. To mitigate these challenges, new wet ALE chemistries and techniques are needed for etching molybdenum and other transition metals.

The present disclosure provides a new wet atomic layer etch (ALE) process for etching a transition metal formed on a substrate. More specifically, the present disclosure provides various embodiments of methods that utilize new etch chemistries for etching molybdenum (Mo) in a wet ALE process. As described in more detail below, the wet ALE processes and methods disclosed herein use a variety of techniques and etch chemistries to oxidize a molybdenum surface exposed on a substrate and form a self-limiting, molybdenum oxide passivation layer (such as, e.g., $MoO_3$) on the underlying Mo surface (e.g., metallic Mo) in a surface modification step of the wet ALE process. The molybdenum oxide passivation layer is then selectively removed in a dissolution step of the wet ALE process to etch the molybdenum surface.

Unlike conventional methods for etching molybdenum, the methods disclosed herein utilize new etch chemistries for etching molybdenum in a wet ALE process that provides self-limiting oxidation and dissolution behavior in aqueous solutions. As used herein, a "self-limiting" oxidation behavior, or "self-limiting" reaction, is one in which the rate of oxidation (or other reaction) goes to zero over time. In comparison to a strictly self-limiting reaction, a "quasi-limiting" reaction is one in which the rate of oxidation (or other reaction) decreases over time but does not go to zero. In the wet ALE processes and methods disclosed herein, self-limiting behavior is provided in the oxidation step by adding a polydentate ligand to an aqueous oxidizing solution. As described in more detail below, the polydentate ligand reacts with and binds to the oxidized molybdenum surface to form a stable, ligand-molybdenum oxide complex, which is insoluble within the aqueous oxidizing solution. The insolubility of the ligand-molybdenum complex in the aqueous oxidizing solution provides self-limiting behavior in the oxidation step. In some embodiments, the wet ALE processes and methods disclosed herein may also provide self-limiting behavior in the dissolution step by adding a ligand (or reducing agent) to the dissolution solution to prevent oxidative damage and preferential grain boundaries attack on the molybdenum surface.

The techniques disclosed herein may be performed on a wide variety of substrates having a wide variety of layers and features formed thereon. In general, the substrates utilized with the techniques disclosed herein may be any substrates for which the etching of material is desirable. For example, the substrate may be a semiconductor substrate having one or more semiconductor processing layers (all of which together may comprise the substrate) formed thereon. In one embodiment, the substrate may be a substrate that has been subject to multiple semiconductor processing steps which yield a wide variety of structures and layers, all of which are known in the substrate processing art. In one embodiment, the substrate may be a semiconductor wafer including the various structures and layers formed.

The techniques disclosed herein may generally be used to etch a wide variety of materials, including polycrystalline materials, single-crystalline materials and amorphous materials. In some embodiments, the techniques disclosed herein may be used to etch a metal material such as, but not limited to, transition metals and noble metals. In one exemplary embodiment, the material to be etched may be molybdenum (Mo). Although the techniques disclosed herein are discussed below in reference to etching molybdenum (Mo), it will be recognized by those skilled in the art that such an example is merely exemplary and the techniques disclosed herein may be used to etch a wide variety of other materials. For example, the techniques disclosed herein may be used to etch other transition metals such as, but not limited to, cobalt (Co), copper (Cu), tungsten (W), vanadium (V), niobium (Nb), tantalum (Ta), titanium (Ti) and chromium (Cr), nickel (Ni) and combinations thereof.

The techniques disclosed herein offer multiple advantages over other etch techniques used for etching transition metals. For example, the techniques disclosed herein provide the benefits of ALE, such as precise control of total etch amount, control of surface roughness, and improvements in wafer-scale uniformity. The techniques disclosed herein also provide various benefits of wet etching, such as the simplicity of the etch chamber, self-limiting reactions at near atmospheric temperature and pressure etching conditions, and reduced surface roughness. Unlike conventional etch processes used to etch transition metals, such as molybdenum, the techniques disclosed herein provide a wet ALE process that provides a self-limiting oxidation step and a selective dissolution step for etching the transition metal. As such, the techniques disclosed herein provide unique methods for etching molybdenum.

FIG. 1 illustrates one embodiment of a method 100 that can be used to etch a substrate using a wet atomic layer etching (ALE) process. More specifically, FIG. 1 illustrates an embodiment of a method 100 that can be used to etch a molybdenum (Mo) layer formed on a substrate using a wet ALE process. It will be recognized that the embodiment of FIG. 1 is merely exemplary and additional methods may utilize the wet ALE techniques described herein. Further, additional processing steps may be added to the method shown in the FIG. 1 as the steps described are not intended to be exclusive. Moreover, the order of the steps is not limited to the order shown in the figures as different orders may occur and/or various steps may be performed in combination or at the same time.

The method 100 shown in FIG. 1 includes receiving a substrate having a molybdenum (Mo) layer formed thereon, wherein a molybdenum surface is exposed on a surface of the substrate (in step 110), and exposing the surface of the substrate to a surface modification solution comprising an oxidizer and a polydentate ligand dissolved in an aqueous solvent (in step 120).

The oxidizer included within the surface modification solution reacts with the molybdenum surface to oxidize the molybdenum surface and form a molybdenum oxide passivation layer. The polydentate ligand binds to the molybdenum oxide passivation layer to form a surface species that is insoluble in the aqueous solvent, thereby providing a self-limiting, molybdenum oxide passivation layer in step 120. A wide variety of oxidizers and polydentate ligands can be included within the surface modification solution, as described in more detail below.

After forming the self-limiting molybdenum oxide passivation layer, method 100 removes the surface modification solution from the surface of the substrate (in step 130), and exposes the surface of the substrate to a dissolution solution to selectively remove the molybdenum oxide passivation layer (in step 140). The dissolution solution reacts with the molybdenum oxide passivation layer to form soluble species that are dissolved by the dissolution solution. The method 100 removes the dissolution solution and the soluble species from the surface of the substrate to etch the molybdenum layer (in step 150). In some embodiments, the method may repeat steps 120-150 a number of times (in step 160) until a predetermined amount of the molybdenum is removed from the substrate.

In the method 100 shown in FIG. 1, ligand-assisted oxidation is used to change the surface chemistry of the molybdenum oxide passivation layer in step 120 and provide self-limiting oxidation behavior in an aqueous oxidizing solution. As noted above, the surface modification solution includes an oxidizer and a polydentate ligand dissolved in an aqueous solvent. The polydentate ligand reacts with and binds to the molybdenum oxide passivation layer to change a surface chemistry of the molybdenum oxide passivation layer, thereby ensuring that the molybdenum oxide passivation layer is self-limiting and insoluble in the aqueous solvent. More specifically, the polydentate ligand reacts with and binds to the molybdenum oxide passivation layer to form a stable, ligand-molybdenum oxide complex (i.e., the surface species) on the surface of the molybdenum oxide passivation layer that is insoluble in the aqueous solvent. The ligand-molybdenum oxide complex suppresses, or substantially prevents, the solubilization of the molybdenum oxide passivation layer within the surface modification solution. In doing so, the polydentate ligand added to the surface modification solution enables a self-limiting, molybdenum oxide passivation layer to be formed in an aqueous oxidizing solution.

In some embodiments, the method 100 shown in FIG. 1 can be used to etch molybdenum (and other transition metals) in a wet ALE process by performing multiple cycles of the wet ALE process, wherein each cycle includes a surface modification step (step 120) to oxidize the molybdenum surface and form a molybdenum oxide passivation layer, and a dissolution step (step 140) to selectively remove the molybdenum oxide passivation layer without removing the unmodified molybdenum surface underlying the passivation layer. Purge steps (steps 130 and 150) are performed between the surface modification and dissolution steps to prevent the surface modification and dissolution solutions from mixing, and the process may be repeated in a cyclic manner until a desired amount of etching is achieved. Example etch chemistries that may be used in the surface modification step (step 120), the dissolution step (step 140) and the purge steps (steps 130 and 150) are described in more detail below.

FIG. 2 illustrates one example of a wet ALE process that can be used to etch molybdenum (and other transition metals) in accordance with a first embodiment of the present disclosure. As described in more detail below, the wet ALE process shown in FIG. 2 is a cyclical process consisting of one or more ALE cycles, where each ALE cycle includes a surface modification step 200, a first purge step 230, a dissolution step 240 and a second purge step 250.

In the wet ALE process shown in FIG. 2, a molybdenum layer 205 surrounded by a dielectric material 210 is brought in contact with a surface modification solution 215 during the surface modification step 200. The surface modification solution 215 contains an oxidizer 220 and a polydentate ligand 224 dissolved in an aqueous solvent. The oxidizer 220 reacts with the surface of the molybdenum layer 205 to oxidize the molybdenum layer 205 and form the molybdenum oxide passivation layer 225. The polydentate ligand 224 reacts with and binds to the molybdenum oxide passivation layer 225 to change the surface chemistry of the molybdenum oxide passivation layer 225, and in doing so, ensures that the molybdenum oxide passivation layer 225 is self-limiting in the surface modification solution 215.

A wide variety of the oxidizers and polydentate ligands may be utilized within the surface modification solution 215. In one embodiment, the oxidizer 220 used in FIG. 2 may be ammonium persulfate (APS), the polydentate ligand 224 may be a hexadentate ligand (such as, e.g., ethylenediaminetetraacetic acid (EDTA) or the diammonium salt of EDTA [$(NH_4)_2$EDTA]) and the aqueous solvent may be deionized water (DIW). APS dissolved in water oxidizes the surface of the molybdenum layer 205 to form a molybdenum oxide passivation layer 225 (such as, e.g., molybdenum trioxide, $MoO_3$). EDTA reacts with and binds to the molybdenum surface, changes the surface product and makes the oxidation process strictly self-limiting. Although APS and EDTA are provided as examples, other oxidizers and polydentate ligands may also be used in the aqueous oxidizing solution, as described in more detail below.

After the molybdenum oxide passivation layer 225 is formed in the surface modification step 200, the first purge step 230 is performed to remove the surface modification solution 215. In the first purge step 230, the substrate is rinsed with a first purge solution 235 to remove the surface modification solution 215 and excess reactants from the surface of the substrate. The first purge solution 235 should not react with the molybdenum oxide passivation layer 225 formed during the surface modification step 200, or with the reactants in the surface modification solution 215. In some embodiments, the first purge solution 235 may use the same solvent (e.g., DIW) used in the surface modification solution 215. However, other solvents may also be utilized, as discussed in more detail below. In some embodiments, the first purge step 230 may be long enough to completely remove all excess reactants from the substrate surface.

After the substrate is rinsed, the dissolution step 240 is performed to selectively remove the molybdenum oxide passivation layer 225 formed during the surface modification step 200. In the dissolution step 240, the substrate is exposed to the dissolution solution 245 to selectively remove or dissolve the molybdenum oxide passivation layer 225 without removing the unmodified molybdenum layer 205 underlying the molybdenum oxide passivation layer 225 or the dielectric material 210 surrounding the molybdenum layer 205. The dissolution solution 245 may generally contain a reactive agent (e.g., an acid or a base) dissolved in an aqueous or non-aqueous solvent. In one embodiment, the dissolution solution 245 may be an aqueous solution comprising a base (such as, e.g., ammonium hydroxide, $NH_4OH$) and a ligand to prevent continuous etching of the unmodified molybdenum layer 205 during the dissolution step 240 and reduce the post-etch roughness of the molybdenum surface. However, other reactive agents and solvents may also be utilized, as discussed in more detail below.

In order to selectively remove the molybdenum oxide passivation layer 225, the molybdenum oxide passivation layer 225 must be soluble, and the unmodified molybdenum layer 205 underlying the molybdenum oxide passivation layer 225 must be insoluble, in the dissolution solution 245. The solubility of the molybdenum oxide passivation layer 225 allows its removal through dissolution into the bulk dissolution solution 245. In some embodiments, the dissolution step 240 may continue until the molybdenum oxide passivation layer 225 is dissolved.

Once the molybdenum oxide passivation layer 225 is dissolved within the dissolution solution 245, the wet ALE etch cycle shown in FIG. 2 may be completed by performing the second purge step 250 to remove the dissolution solution 245 from the surface of the substrate. In the second purge step 250, the substrate is rinsed with a second purge solution 255, which may be the same or different than the first purge solution 235. In some embodiments, the second purge solution 255 may use the same solvent (e.g., DIW) used within the surface modification solution 215. However, other solvents may also be utilized, as discussed in more detail below. The second purge step 250 may generally continue until the dissolution solution 245 and/or the reactants and soluble species contained with the dissolution solution 245 are completely removed from the surface of the substrate.

Wet ALE of molybdenum requires the formation of a self-limiting passivation layer on the underlying unmodified molybdenum layer. This passivation layer must be insoluble in the first etch solution used for its formation (i.e., surface modification solution 215), but freely soluble in a second etch solution (i.e., dissolution solution 245) used for its dissolution. The self-limiting passivation layer must be removed every cycle after its formation. The second etch solution is used to selectively dissolve the passivation layer without etching the underlying unmodified tungsten layer.

The wet ALE process shown in FIG. 2 uses ligand-assisted oxidation to ensure self-limiting oxidation behavior by controlling the reaction product and avoiding the formation of oxidation products that are soluble in the surface modification solution 215. In the wet ALE process shown in FIG. 2, a polydentate ligand 224 (such as, e.g., EDTA or the diammonium salt of EDTA [(NH$_4$)$_2$EDTA]) is added to the surface modification solution 215 to change the surface chemistry of the molybdenum oxide passivation layer 225. Changing the surface chemistry of the molybdenum oxide passivation layer 225 ensures self-limiting oxidation behavior by forming a surface species, which is insoluble within the aqueous solvent (for example, DIW) included within the surface modification solution 215, but soluble within the dissolution solution 245. The molybdenum oxide passivation layer 225 is then selectively removed in the dissolution solution 245. This prevents the evolution of surface roughness with etch amount, resulting in well-controlled etch uniformity within wafer and from wafer to wafer. The use of ligand binding in the oxidation/surface modification step 200 also prevents preferential grain boundary etching, resulting in better post-etch morphology.

A wide variety of surface modification solutions may be used in the wet ALE process and methods described above to oxidize the molybdenum surface and form a self-limiting molybdenum oxide passivation layer 225. As noted above, the surface modification solution 215 may include an oxidizer 220 and a polydentate ligand 224 dissolved in water. A wide variety of peroxide and non-peroxide oxidizers may be utilized within the surface modification solution 215 to oxidize the molybdenum surface and form the molybdenum oxide passivation layer 225. Examples of non-peroxide oxidizers include, but are not limited to, ammonium persulfate (APS), ferric chloride (FeCl$_3$), osmium tetroxides, ruthenium tetroxides, ruthenates, manganates, permanganates, periodates, and metal nitrates. Examples of peroxide oxidizers include hydrogen peroxide (H$_2$O$_2$), organic peroxides (such as di-tert-butyl peroxide (C$_8$H$_{18}$O$_2$) and tert-butyl peroxybenzoate (C$_{11}$H$_{14}$O$_3$)), monoperoxides (such as tert-butyl hydroperoxide (C$_4$H$_{10}$O$_2$)), peroxy acids (such as peracetic acid (C$_2$H$_4$O$_3$)). In one example embodiment, APS may be used within the surface modification solution 215 to oxidize the molybdenum surface and form a molybdenum trioxide (MoO$_3$) passivation layer on the underlying molybdenum (e.g., metallic Mo).

A wide variety of polydentate ligands may be added to the surface modification solution 215 to render the molybdenum oxide passivation layer 225 (e.g., MoO$_3$) at least partially insoluble within the surface modification solution 215. As known in the art, a polydentate ligand is a ligand having at least two donor atoms, which can attach to a single metal cation or atom. In some embodiments, the polydentate ligand 224 added to the surface modification solution 215 may be a bidentate ligand having two donor atoms, a tridentate ligand having three donor atoms, a tetradentate ligand having four donor atoms, a pentadentate ligand having five donor atoms, a hexadentate ligand having six donor atoms, etc. Examples of polydentate ligands that may be included within the surface modification solution 215 include, but are not limited to, oxalic acid (bidentate), acetic acid (bidentate), ascorbic acid (bidentate), mandelic acid (bidentate), malic acid (bidentate), maleic acid (bidentate), fumaric acid (bidentate), ethylenediamine (bidentate), the acetylacetonate ion (bidentate), diethylenetriamine (tridentate), terpyridine (tridentate), diaminopyridine (tridentate), pentamethyl diethylenetriamine (tridentate), triethylenetetramine (tetradentate), nitrilotriacetate (tetradentate), tetraethylenepentamine (pentadentate), ethylenediaminetetraacetic acid (EDTA, hexadentate) and the diammonium salt of EDTA [(NH$_4$)$_2$EDTA] (hexadentate).

The polydentate ligand 224 added to the surface modification solution 215 reacts with and binds to the molybdenum oxide passivation layer 225 (e.g., MoO$_3$) to form a ligand-molybdenum oxide complex on the surface of the molybdenum oxide passivation layer 225. The ligand-molybdenum oxide complex formed on the surface of the molybdenum oxide passivation layer 225 suppresses, or substantially prevents, the solubilization of the molybdenum oxide passivation layer 225 within the surface modification solution 215. The degree of suppression is dependent on the stability of the ligand-molybdenum oxide complex within the surface modification solution 215. In some embodiments, polydentate ligands having a greater number of donor atoms (e.g., 3 or more) may be preferred, since they bind with the molybdenum oxide surface at more points to increase the stability of ligand-molybdenum oxide complex in the aqueous oxidizing solution.

In one example embodiment, the surface modification solution 215 may include APS and a hexadentate ligand, such as EDTA or the diammonium salt of EDTA [(NH$_4$)$_2$EDTA], dissolved in deionized water. When (NH$_4$)$_2$EDTA is included within the surface modification solution 215, (NH$_4$)$_2$EDTA reacts with and binds to the molybdenum oxide passivation layer 225 (e.g., MoO$_3$) to form a stable, ligand-molybdenum oxide complex (such as, e.g., diammonium ditrartrate(diaqua)dinuclearmolybdate [(NH$_4$)$_2$[Mo$_2$O$_4$(C$_4$H$_4$O$_6$)$_2$(H$_2$O)$_2$]]) on the surface of the molybdenum oxide passivation layer 225 that is insoluble in water, thereby forming a self-limiting molybdenum oxide passivation layer 225 in aqueous solution. However, other combinations of oxidizers and polydentate ligands may also be used within the surface modification solution 215 to provide a self-limiting molybdenum oxide passivation layer 225 in aqueous solution.

A wide variety of dissolution solutions may be used in the wet ALE process and methods described above to selectively remove the molybdenum oxide passivation layer 225 (e.g., $MoO_3$) without removing the unmodified molybdenum layer 205 underlying the molybdenum oxide passivation layer 225 or the dielectric material 210 surrounding the molybdenum layer 205. For example, the dissolution solution 245 may be: (a) an aqueous acid solution comprising hydrochloric acid (HCl), nitric acid or sulfuric acid, (b) an aqueous basic solution comprising ammonium hydroxide ($NH_4OH$), tetramethylammonium hydroxide (TMAH), potassium hydroxide (KOH) or calcium hydroxide (Ca(OH)$_2$), (c) a non-aqueous ligand solution comprising alpha-benzoin oxime in acetone, dimethyl sulfoxide (DMSO), methyl-ethyl ketone (MEK) or another ketone, or (d) an aqueous ligand solution comprising a base (or an acid) and a ligand.

In some embodiments, the dissolution solution 245 may be: (i) an aqueous basic solution containing a ligand and a base, or (ii) an aqueous acidic solution containing a ligand and an acid. The base (or acid) included within the dissolution solution 245 removes the molybdenum oxide passivation layer 225 to expose the unmodified molybdenum layer 205 underlying the molybdenum oxide passivation layer 225. Examples of bases that may be included within the dissolution solution 245 include, but are not limited to, ammonium hydroxide ($NH_4OH$), tetramethylammonium hydroxide (TMAH), potassium hydroxide (KOH), sodium hydroxide (NaOH) or calcium hydroxide (Ca(OH)$_2$). Examples of acids include, but are not limited to, hydrochloric acid (HCl), nitric acid ($HNO_3$) and sulfuric acid ($H_2SO_4$).

In some embodiments, the ligand added to the dissolution solution 245 may prevent oxidative damage on the exposed molybdenum surface and prevent the base (or the acid) from attacking and removing the unmodified molybdenum layer 205 underlying the molybdenum oxide passivation layer 225. In some embodiments, the ligand added to the dissolution solution 245 may react with and bind to the unmodified molybdenum layer 205 to change the surface chemistry of the unmodified molybdenum layer 205. In doing so, the ligand may prevent parasitic oxidation of the unmodified molybdenum layer 205 during the dissolution step 240 by blocking the unmodified molybdenum surface. In other embodiments, the ligand added to the dissolution solution 245 may be a reducing agent that inhibits oxidation of the unmodified molybdenum surface. As known in the art, a "reducing agent" is a chemical species that reduces another element, molecule or compound by donating an electron to the other element, molecule or compound (i.e., an electron recipient) during an oxidation-reduction reaction. During the reaction, the reducing agent loses an electron to, and absorbs oxygen from, the electron recipient. In doing so, the reducing agent becomes oxidized and the electron recipient becomes reduced (by losing an oxygen). By adding the ligand (or reducing agent) to the dissolution solution 245, the wet ALE process and methods disclosed herein may inhibit oxidation of the unmodified molybdenum surface and prevent continuous etching of the molybdenum layer 205 during the dissolution step 240. This enables the wet ALE process and methods to provide a post-etch surface roughness of the molybdenum layer 205 that is substantially equal to an initial surface roughness of the molybdenum layer 205 before etching.

A wide variety of ligands may be added to the dissolution solution 245. In some embodiments, the ligand added to the dissolution solution 245 may contain an ascorbate anion. For example, the ligand may be ascorbic acid ($C_6H_8O_6$), sodium ascorbate ($C_6H_7NaO_6$), calcium ascorbate ($C_{12}H_{14}CaO_{12}$) or potassium ascorbate ($KC_6H_7O_6$). Ascorbic acid is a water-soluble organic acid, whose conjugate base is the ascorbate anion. The ascorbate anion is a mild reducing agent and antioxidant (a compound that inhibits oxidation) that forms water-soluble salts when exposed to various metals, such as sodium ascorbate, calcium ascorbate and potassium ascorbate. On exposure to oxygen, ascorbic acid will undergo further oxidative decomposition to form various products such as, for example, oxalic acid. Ligands containing ascorbate anions (such as, e.g., ascorbic acid) prevent continuous etching of the molybdenum layer 205 during the dissolution step 240 by preventing oxidative damage on the exposed tungsten surface and preventing the base (or the acid) from attacking and removing the unmodified molybdenum layer 205. However, other reducing agents can also be used to prevent continuous etching of the molybdenum layer during the dissolution step 240. For example, carboxylic acids (such as, e.g., oxalic acid ($C_2H_2O_4$), formic acid (HCOOH), acetic acid ($CH_3COOH$), etc.), amine-containing ligands (such as, e.g., ethylenediamine ($C_2H_8N_2$), ethylenediaminetetraacetic acid (EDTA, $C_{10}H_{16}N_2O_8$), iminodiacetic acid ($C_4H_8NO_4$) etc.) or other molecules that bind to the tungsten metal surface through N, P, O, or S heteroatoms can also be used in the dissolution solution 245. Although several different types of reducing agents may be used, ligands containing ascorbate anions (such as, e.g., ascorbic acid) may enable higher etch rates than ligands containing other anions (such as, e.g., formate anions, oxalate anions, etc.), and thus, may be preferred in some embodiments.

In one example embodiment, an aqueous basic solution comprising a ligand and a base may be used in the dissolution solution 245 to selectively remove a molybdenum trioxide ($MoO_3$) passivation layer. The base removes the molybdenum trioxide ($MoO_3$) passivation layer to expose the unmodified molybdenum surface underlying the passivation layer. The ligand prevents the base from attacking and removing the unmodified molybdenum surface and increasing the post-etch surface roughness of the molybdenum layer 205 compared to the initial surface roughness of the molybdenum layer 205 before etching. The amount of ligand needed to prevent parasitic etch of the unmodified molybdenum surface depends on the concentration of the base included within the dissolution solution 245. In some embodiments, the dissolution solution 245 may be an aqueous ligand solution comprising 0 mM to 100 mM ascorbic acid dissolved in 0.05 mM to IM of ammonium hydroxide ($NH_4OH$) and water. In one example implementation, 10 mM of ascorbic acid dissolved in 2-100 mM of $NH_4OH$ may be used in the dissolution solution 245 to provide self-limiting dissolution of the molybdenum trioxide ($MoO_3$) passivation layer. However, other bases and ligands may be used in the dissolution solution 245 to prevent continuous etching of the molybdenum layer 205 and preserve post-etch surface roughness.

Experimental Results

Etching experiments were conducted on 15 mm×15 mm coupons cut from a 300 mm silicon wafer with various thicknesses of physical vapor deposition (PVD) molybdenum (Mo) deposited on one side to investigate the wet ALE process shown in FIG. 2. The etching experiments used to etch an exposed molybdenum surface included multiple wet ALE cycles, where each cycle includes a dip in a surface modification solution 215 containing various concentrations of ammonium persulfate (APS) and the diammonium salt of EDTA [(NH$_4$)$_2$EDTA] in deionized water (DIW), followed by a DIW/methanol rinse, a dip in a dissolution solution 245 containing various concentrations of ammonium hydroxide (NH$_4$OH) and ascorbic acid in deionized water, a DIW/methanol rinse and blow dry. Each wet ALE process was repeated for a number of ALE cycles under different process conditions to investigate the etch rate achieved by the wet ALE process shown in FIG. 2 using various oxidation and dissolution chemistries. Additional etching experiments were conducted to investigate the effect that: (a) oxidation temperature, concentration and time, (b) dissolution concentration and time, and (c) ligand choice and concentration have on the etch rate.

Figure 3:
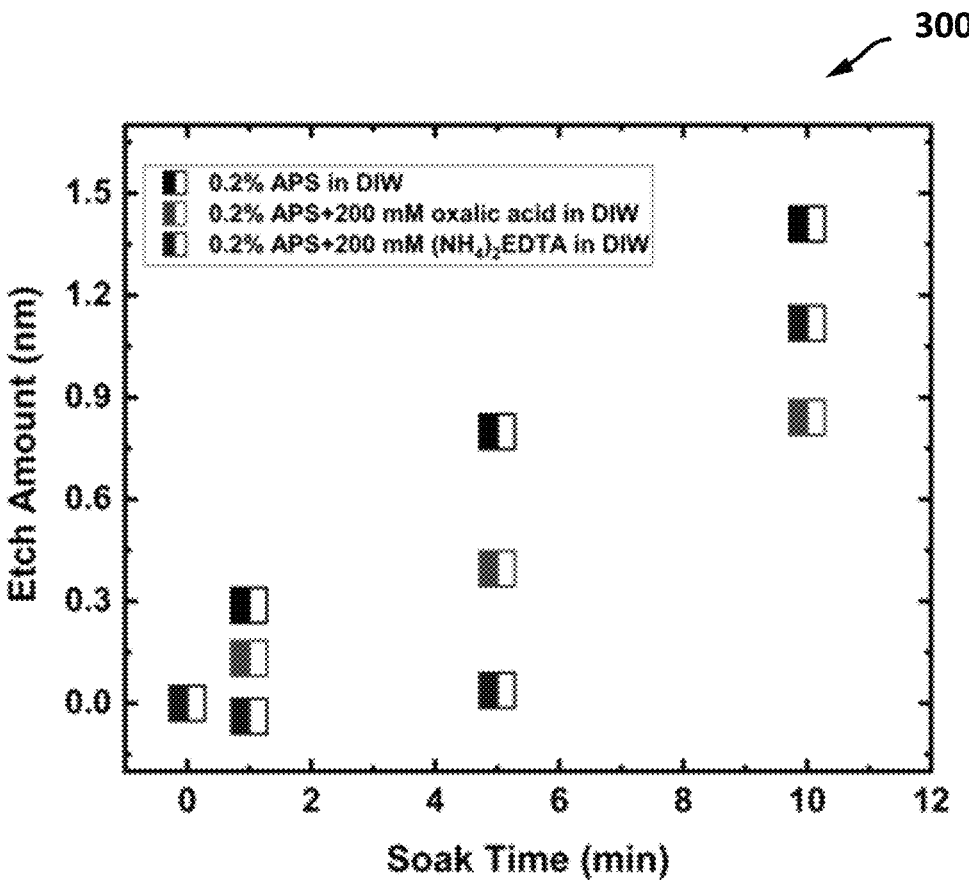
FIG. 3 is a graph depicting exemplary etch amounts (expressed in nanometers, nm) that may be achieved over time (expressed in minutes, min) when etching a molybdenum surface using various surface modification solutions.

The graph 300 shown in FIG. 3 depicts exemplary etch amounts (expressed in nanometers, nm) achieved as a function of oxidation time (expressed in minutes, min) when using various surface modification solutions with and without ligand-assisted oxidation to oxidize the Mo coupons in the wet ALE process shown in FIG. 2. To obtain the results shown in the graph 300, the surface of the Mo coupon was exposed to various surface modification solutions for variable lengths of time (e.g., 0-10 minutes) to oxidize the molybdenum surface and form a molybdenum oxide passivation layer. Specifically, the molybdenum surface was exposed to 0.2% APS in DIW, 0.2% APS+200 mM oxalic acid in DIW and 0.2% APS+200 mM (NH$_4$)$_2$EDTA in DIW in three separate wet ALE processes. After performing the surface modification and rinsing with DIW/methanol, the Mo coupons were exposed to an aqueous dissolution solution of 2 mM ammonium hydroxide (NH$_4$OH)+10 mM ascorbic acid (AA) for 10 seconds, followed by a DIW/methanol rinse and blow dry.

The graph 300 shows that oxidation of the molybdenum surface with the 0.2% APS-DIW solution is not self-limiting. The surface oxide product (MoO$_3$) is soluble in aqueous solution, and the simultaneous oxidation and dissolution of the surface oxide product leads to a continuous etch. The addition of oxalic acid (a bidentate ligand) in the 0.2% APS-DIW solution suppresses the etch amount, indicating that the ligand creates a relatively stable, ligand-metal oxide surface complex that changes the solubility rate of surface oxide product. However, the aqueous APS-oxalic acid solution still results in a continuous etch of the molybdenum surface, indicating the non-self-limiting nature of the surface reaction. On the other hand, adding 200 mM (NH$_4$)$_2$EDTA (a hexadentate ligand) to the 0.2% APS-DIW solution suppresses the Mo etch for up to about 5 minutes, indicating the formation of a very stable ligand-metal oxide complex that is insoluble in the aqueous oxidizing solution. Thus, the graph 300 shows that self-limiting oxidation behavior can be achieved by adding a hexadentate ligand to the surface modification solution. The self-limiting oxidation behavior breaks down after oxidation times longer than 5 minutes.

Figure 4:
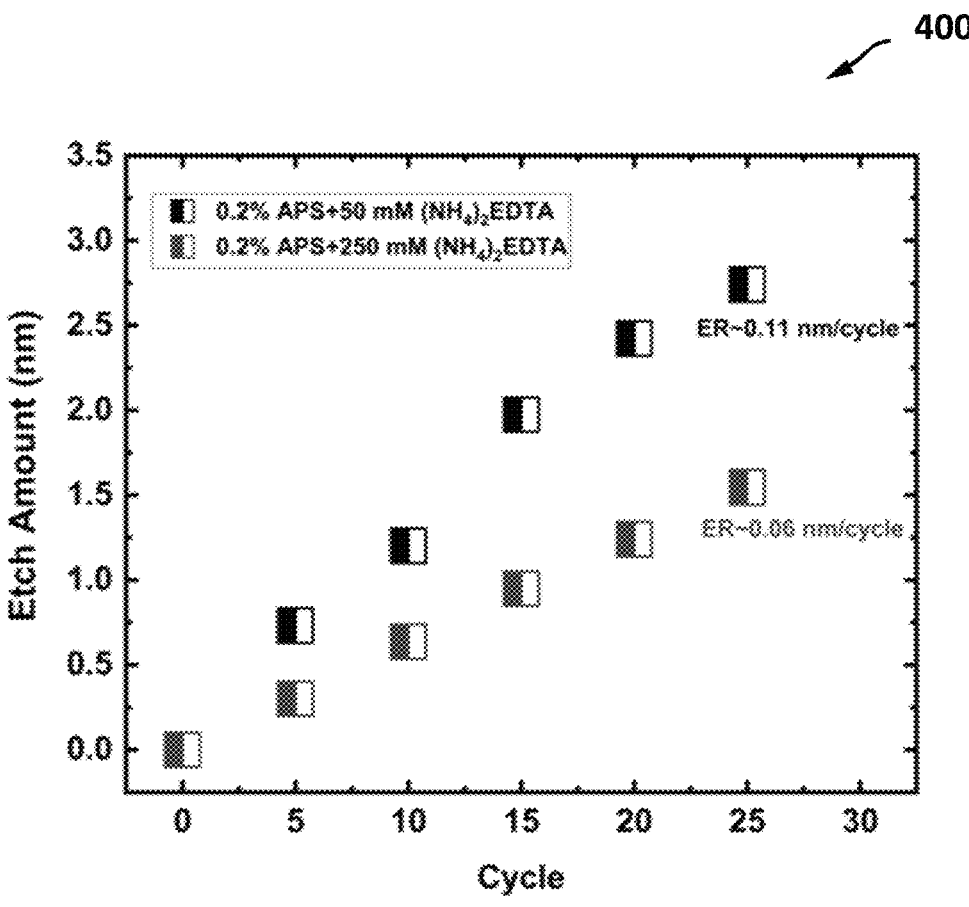
FIG. 4 is a graph depicting exemplary etch amounts (expressed in nanometers, nm) as a function of cycle number for two different surface modification solutions, illustrating the effect of ligand concentration on etch rate (expressed in nm/cycle).

The graph 400 shown in FIG. 4 depicts exemplary etch amounts (expressed in nm) as a function of cycle number for two different surface modification solutions (0.2% APS+50 mM (NH$_4$)$_2$EDTA in DIW and 0.2% APS+250 mM (NH$_4$)$_2$EDTA in DIW), illustrating the effect of ligand concentration on the Mo etch rate (expressed in nm/cycle). As shown in the graph 400, the etch amount increases linearly with cycle number in both surface modification solutions. However, the etch amount decreases with increasing (NH$_4$)

$_2$EDTA concentration, indicating that the Mo etch rate (ER) is self-limiting with the EDTA concentration under study. The Mo etch rate drops from ~0.11 nm/cycle to ~0.06 nm/cycle when (NH$_4$)$_2$EDTA concentration is increased from 50 mM to 250 mM in 0.2% APS-DIW solution. The change in Mo etch rate may be due to EDTA changing the surface chemistry of the surface oxide product, due to the formation of a stable ligand-metal oxide complex that is less soluble in the dissolution solution or a combination of both.

Figure 5:
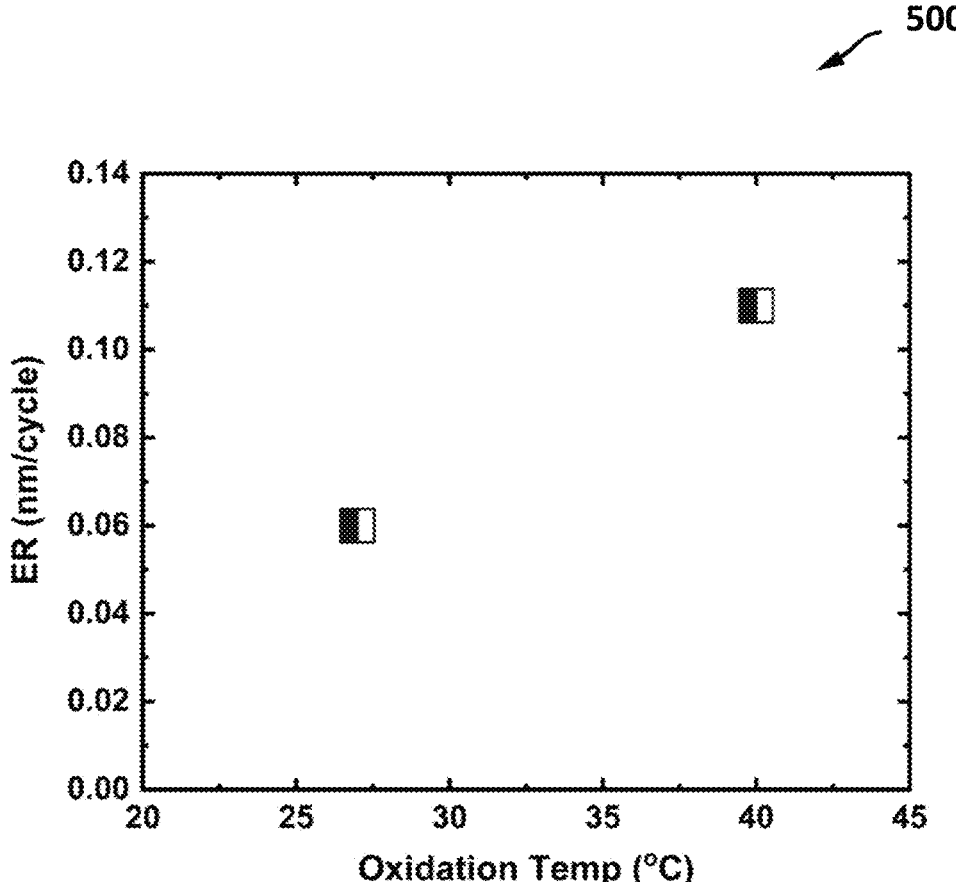
FIG. 5 a graph depicting the effect of oxidation temperature (expressed in ° C.) on etch rate (expressed in nm/cycle) when etching a molybdenum surface using 0.2% ammonium persulfate (APS) and 250 mM of $(NH_4)_2EDTA$ in water as the surface modification solution at various temperatures (e.g., room temperature and 40° C.).

The graph 500 shown in FIG. 5 depicts the effect of oxidation temperature (expressed in ° C.) on the Mo etch rate (expressed in nm/cycle). To obtain the results shown in the graph 500, the surface of the Mo coupon was exposed to 0.2% APS+250 mM of (NH$_4$)$_2$EDTA in DIW at two different temperatures (e.g., room temperature and 40° C.) to modify the Mo surface, followed by dissolution of the modified Mo surface in 2 mM NH$_4$OH+10 mM ascorbic acid (AA) solution. The graph 500 shows a significant increase in the Mo etch rate at an elevated oxidation temperature (e.g., 40° C.), which suggests that the surface oxidation kinetics increase with temperature, leading to the formation of a thicker oxide layer. The oxide thickness and nature of the surface oxide product may change at higher oxidation temperatures. The solubility of the surface oxide product may also be thermodynamically more favorable in dissolution chemistry and lead to a higher etch rate.

Figure 6:
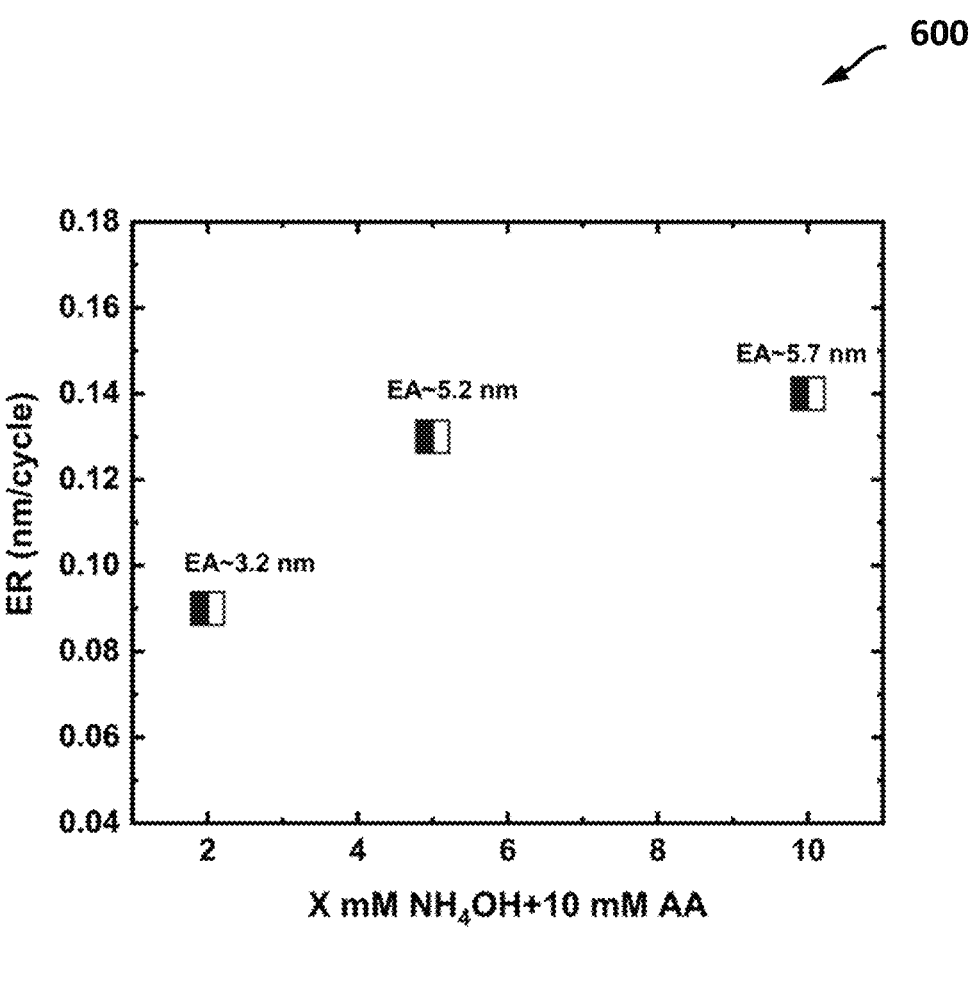
FIG. 6 is a graph depicting the effect of ammonium hydroxide ($NH_4OH$) concentration on etch rate (expressed in nm/cycle) when etching a molybdenum surface using various dissolution solutions comprising ammonium hydroxide ($NH_4OH$) and ascorbic acid (AA).

The graph 600 shown FIG. 6 depicts the effect of ammonium hydroxide (NH$_4$OH) concentration on the Mo etch rate (expressed in nm/cycle). To obtain the results shown in the graph 600, the surface of the Mo coupons were exposed to 0.2% APS+167 mM of (NH$_4$)$_2$EDTA in DIW at 40° C. for 10 seconds, followed by a DIW/methanol rinse, a 10 second dip in various dissolution solutions (e.g., 2 mM NH$_4$OH+10 mM AA solution, 5 mM NH$_4$OH+10 mM AA solution and 10 mM NH$_4$OH+10 mM AA solution) and a DIW/methanol rinse. The graph 600 illustrates the Mo etch rate obtained as a function of NH$_4$OH concentration for the same oxidizing solution (0.2% APS with 167 mM (NH$_4$)$_2$EDTA in DIW solution). As shown in the graph 600, the Mo etch rate increases from ~0.09 nm/cycle to ~0.13 nm/cycle when the NH$_4$OH concentration changes from 2 mM to 5 mM and remains nearly constant between 5-10 mM. This suggests that the solubility of the surface oxide product (e.g., MoO$_3$) increases with NH$_4$OH concentration up to about 5 mM before stabilizing.

Figure 7:
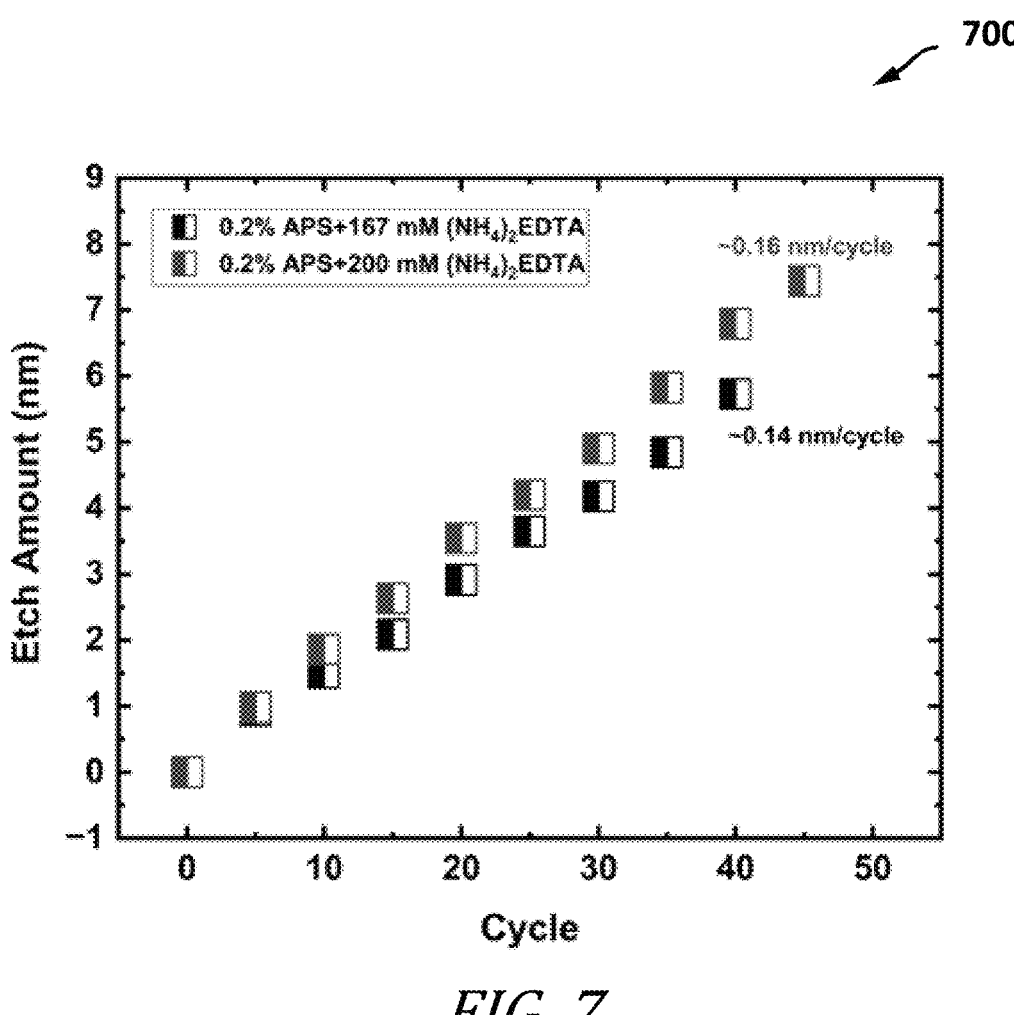
FIG. 7 is a graph depicting the effect of $(NH_4)_2EDTA$ concentration on etch rate (expressed in nm/cycle) when etching a molybdenum surface using various surface modification solutions comprising 0.2% APS and $(NH_4)_2EDTA$.

The graph 700 shown FIG. 7 depicts the effect of (NH$_4$)$_2$EDTA concentration on the Mo etch rate (expressed in nm/cycle). To obtain the results shown in the graph 700, the surface of the Mo coupon was exposed to various surface modification solutions (e.g., 0.2% APS+167 mM of (NH$_4$)$_2$EDTA in DIW and 0.2% APS+200 mM of (NH$_4$)$_2$EDTA in DIW) at 40° C. for 10 seconds, followed by a DIW/methanol rinse, a 10 second dip in 10 mM NH$_4$OH+10 mM AA solution and a DIW/methanol rinse. The graph 700 illustrates the Mo etch amount (expressed in nm) as a function of cycle number for different (NH$_4$)$_2$EDTA concentrations. As shown in the graph 700, the Mo etch amount increases slightly with (NH$_4$)$_2$EDTA concentration and varies linearly with cycle number. However, the Mo etch rate does not vary significantly in the oxidizing solutions and increases only slightly from ~0.14 nm/cycle to ~0.16 nm/cycle when the (NH$_4$)$_2$EDTA concentration changes from 167 mM to 200 mM.

Figures 8A, 8B:
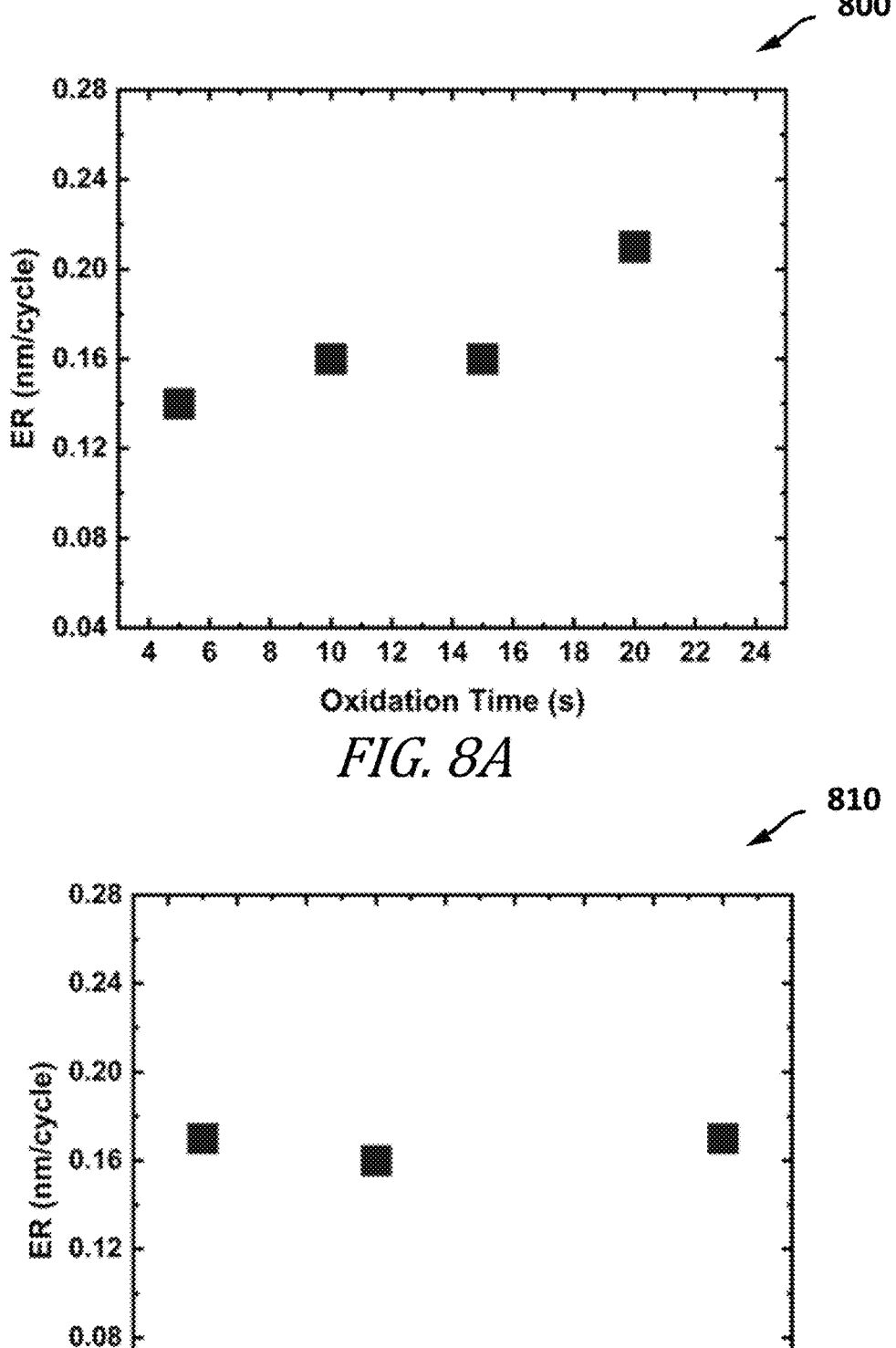
FIG. 8A is a graph depicting exemplary etch rate (expressed in nm/cycle) achieved as a function of oxidation time (expressed in seconds, s) when using a 0.2% APS+200 mM $(NH_4)_2EDTA$-DIW solution to oxidize the molybdenum surface in the wet ALE process shown in FIG. 2.
FIG. 8B is a graph depicting exemplary etch rate (expressed in nm/cycle) achieved as a function of dissolution time (expressed in seconds, s) when using a 10 mM $NH_4OH$+10 mM AA solution to selectively remove the molybdenum oxide passivation layer in the wet ALE process shown in FIG. 2.

Additional etch experiments were performed to investigate the effect of oxidation time and dissolution time on the Mo etch rate. The graph 800 shown in FIG. 8A depicts exemplary etch rates (expressed in nm/cycle) achieved as a function of oxidation time (expressed in seconds, s) when the molybdenum surface is etched by dipping the Mo coupon in 0.2% APS+200 mM of $(NH_4)_2$EDTA in DIW at 40° C. for various oxidation times, followed by dissolution of the oxidized surface by dipping the Mo coupon in 10 mM $NH_4OH$+10 mM AA solution for 10 seconds. As shown in the graph 800, the Mo surface oxidation nearly saturates in about 5 seconds and a constant etch rate (~0.16 nm/cycle) is achieved between approximately 10-15 seconds of oxidation time, indicating the existence of a small ALE window (~5 seconds). A continuous etch past the ALE window indicates the breakdown of self-limiting window at longer oxidation times. The graph 810 shown in FIG. 8B depicts exemplary etch rates (expressed in nm/cycle) achieved as a function of dissolution time (expressed in seconds, s) when the molybdenum surface is etched by dipping the Mo coupon in 10 mM $NH_4OH$+10 mM AA solution after oxidizing the molybdenum coupon in 0.2% APS+200 mM of $(NH_4)_2$EDTA in DIW at 40° C. for 10 seconds. As shown in the graph 810, the dissolution solution can selectively remove the modified layer in as fast as 5 seconds. A constant Mo etch rate (~0.16 nm/cycle) is achieved between approximately 5-20 seconds of dissolution time, which indicates that the dissolution of the molybdenum oxide passivation layer is also self-limiting in nature.

To better understand the surface product after oxidizing the Mo coupon in APS-DIW solution with $(NH_4)_2$EDTA, the surface species were characterized using x-ray photoelectron spectroscopy (XPS). The XPS spectra (not shown herein) showed a difference in the oxidation state of molybdenum for two different ligands ($(NH_4)_2$EDTA and oxalic acid) in an APS solution. When the Mo coupon was oxidized in a non-aqueous APS-oxalic acid solution, the Mo $3d$ peak shifted towards lower binding energy, indicating that a lower oxidation state of Mo dominates the formation of the surface oxide in this solution. The presence of a satellite peak after oxidizing Mo in the non-aqueous APS-oxalic acid solution indicates that the suboxides of Mo are present as surface species. However, when the Mo coupon was oxidized in an aqueous APS-$(NH_4)_2$EDTA acid solution, the Mo $3d$ spectra shifted towards higher binding energy, indicating that a higher oxidation state of Mo dominates the surface oxidation in this solution. An additional peak at around 229 eV was observed in the Mo $3d$ spectra when the surface was oxidized in the aqueous APS-$(NH_4)_2$EDTA acid solution, showing the existence of additional surface species that were not achieved when oxidizing Mo in the non-aqueous APS-oxalic acid solution. The C Is spectra showed an additional peak in the aqueous APS-$(NH_4)_2$EDTA acid solution at around 288.8 eV. The surface oxide product formed in the aqueous APS-$(NH_4)_2$EDTA acid solution may be diammonium ditrartrate(diaqua)dinuclearmolybdate $[(NH_4)_2[Mo_2O_4(C_4H_4O_6)_2(H_2O)_2]$.

Figure 9:
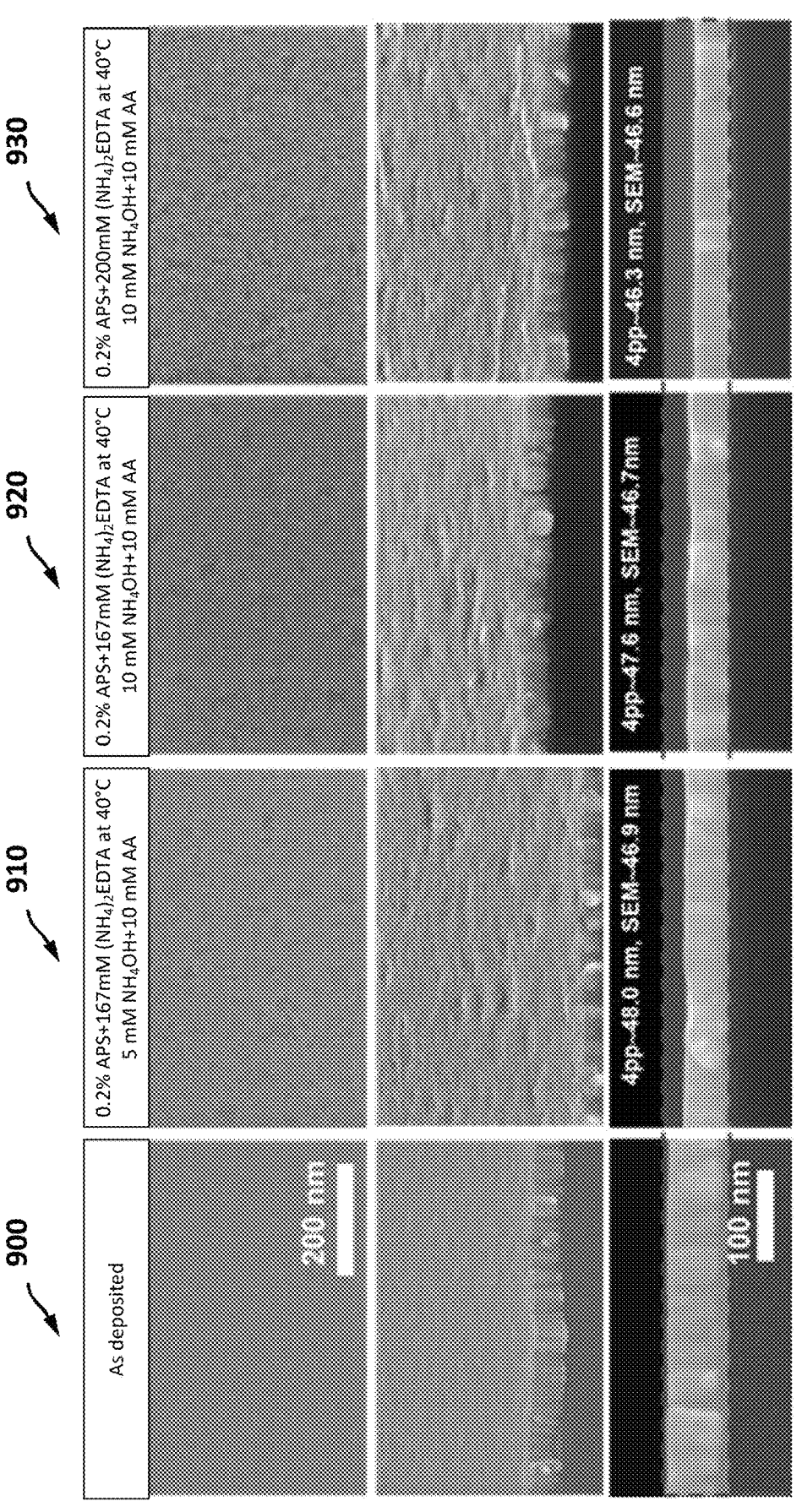
FIG. 9 provides scanning electron microscope (SEM) images depicting as-deposited molybdenum and post-etch molybdenum for various etch conditions used in the wet ALE process shown in FIG. 2.

FIG. 9 provides scanning electron microscope (SEM) images of top, tilt and cross-sectional view of as-deposited molybdenum (900) and post-etch molybdenum (910, 920 and 930) coupons to illustrate the post etch surface morphology of a molybdenum surface etched using different ligand concentrations (e.g., 167 mM $(NH_4)_2$EDTA and 200 mM $(NH_4)_2$EDTA) in the surface modification solution and different base concentrations (e.g., 5 mM $NH_4OH$ and 10 mM $NH_4OH$) in the dissolution solution. After performing the surface modification, rinse and dissolution steps, and repeating each wet ALE process for a number of cycles, 4-point probe (4 pp) resistivity measurements were obtained to measure the etch amount achieved in each wet ALE process.

As shown in FIG. 9, the top and tilt views of the SEM images show relatively smooth post-etch morphology in each of the post-etch images (910, 920 and 930). The cross-sectional view of the SEM images shows the amount of material removed from the Mo surface. The Mo thickness measured using the 4 pp measurement method is nearly the same as the thickness measured from each of the post-etch SEM images, a further indication that post-etch surface is smooth. The smooth post-etch surface may be attributed to: (a) the addition of $(NH_4)_2$EDTA in the APS-DIW solution forming a stable ligand-metal oxide complex that is insoluble in the aqueous oxidizing solution, and/or (b) the addition of ascorbic acid in the $NH_4OH$ solution, which prevents oxidative damage to the Mo surface via radical scavenging.

Figure 10:
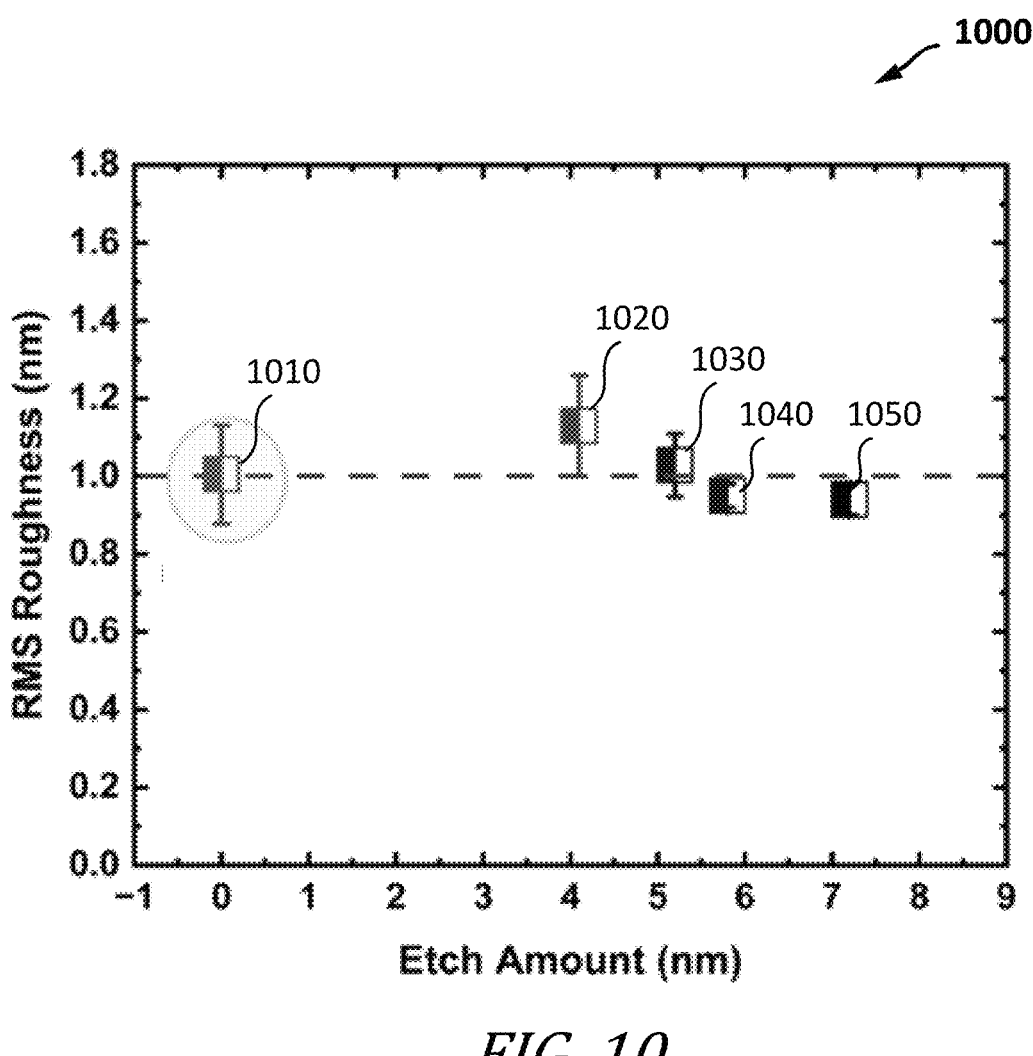
FIG. 10 is a graph depicting the variation in root mean square (RMS) surface roughness (expressed in nm) as a function of molybdenum (Mo) etch amount (expressed in nm) for an asmolybdenum and post-etch molybdenum using various oxidizing solutions and dissolution solutions.

Atomic force images (AFM) were also obtained for as-deposited molybdenum and post-etch molybdenum coupons to illustrate the post etch surface morphology of a molybdenum surface etched using different oxidizing and dissolution solutions. The graph 1000 shown in FIG. 10 illustrates the variation in root mean square (RMS) surface roughness (expressed in nm) as a function of Mo etch amount (expressed in nm) for: (a) an as-deposited reference Mo coupon (1010), (b) a first post-etch Mo coupon (1020) etched using an oxidizing solution containing 0.2% APS+0.5 M oxalic acid (OA) in methanol at 40° C. and a dissolution solution containing 2 mM $NH_4OH$+10 mM AA, (c) a second post-etch Mo coupon (1030) etched using an oxidizing solution containing 0.2% APS+167 mM $(NH_4)_2$EDTA in DIW at 40° C. and a dissolution solution containing 5 mM $NH_4OH$+10 mM AA, (d) a third post-etch Mo coupon (1040) etched using an oxidizing solution containing 0.2% APS+167 mM $(NH_4)_2$EDTA in DIW at 40° C. and a dissolution solution containing 10 mM $NH_4OH$+10 mM AA, and (c) a fourth post-etch Mo coupon (1050) etched using an oxidizing solution containing 0.2% APS+200 mM $(NH_4)_2$EDTA in DIW at 40° C. and a dissolution solution containing 10 mM $NH_4OH$+10 mM AA.

As shown in the graph 1000, the RMS roughness of post-etch coupon using $(NH_4)_2$EDTA in 0.2% APS-DIW solution is nearly the same as the as-deposited Mo reference coupon. The surface smoothness is preserved up to about 7.5 nm Mo etch. The AFM results show higher RMS roughness (~1.13±0.13) nm in the first post-etch Mo coupon (1020) oxidized in the non-aqueous oxidizing solution containing the bidentate ligand (oxalic acid) than the RMS roughness (~0.94±0.04) nm of the post-etch Mo coupons (1030, 1040, 1050) oxidized in the aqueous oxidizing solution containing the hexadentate ligand ($(NH_4)_2$EDTA).

The etching experiments and results shown in FIGS. 3-10 used an aqueous oxidizing solution containing 0.2% APS and various ligands (oxalic acid and $(NH_4)_2$EDTA) and ligand concentrations in DIW. Additional etching experiments were performed to investigate the effect that increasing the APS and $(NH_4)_2$EDTA concentrations have on the Mo etch rate.

Figure 11:
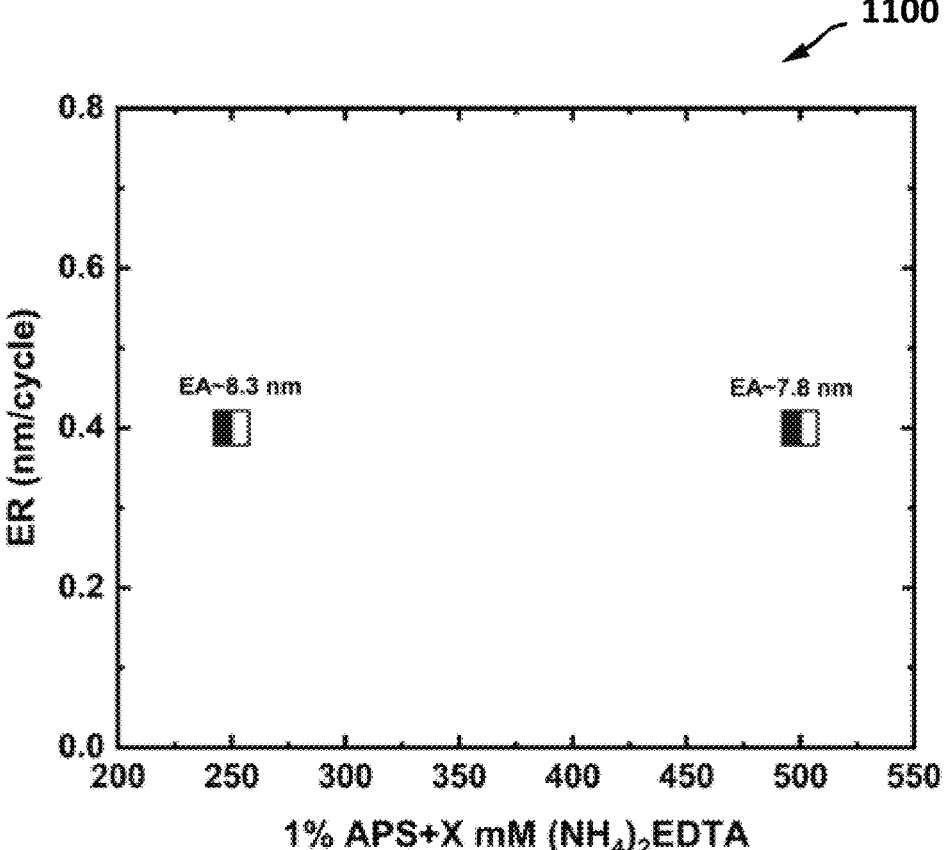
FIG. 11 is a graph depicting exemplary etch rates (expressed in nm/cycle) achieved as a function of $(NH_4)_2EDTA$ concentration in a 1% APS-$(NH_4)_2EDTA$-DIW solution.

The graph 1100 shown in FIG. 11 depicts the Mo etch rate (expressed in nm/cycle) as a function of $(NH_4)_2$EDTA concentration in a 1% APS-$(NH_4)_2$EDTA-DIW solution. For the same $(NH_4)_2$EDTA concentration (250 mM), increasing the APS concentration from 0.2% to 1% changes the Mo etch rate from ~0.11 nm/cycle (see, FIG. 5) to ~0.4 nm/cycle (see, FIG. 11). The increase in Mo etch rate in the 1% APS-250 mM $(NH_4)_2$EDTA DIW solution indicates the non-self-limiting nature of the Mo etch with APS concentration. The increase in Mo etch rate may be attributed to the change in oxide thickness with APS concentration. On the other hand, the graph 1100 shows that for the same APS concentration (1%), the Mo etch rate is independent of the $(NH_4)_2EDTA$ concentrations under study (250 mM and 500 mM). A constant Mo etch rate (~0.40 nm/cycle) between 250 mM and 500 mM of $(NH_4)_2EDTA$ in 1% APS-DIW solution suggests that the nature of surface oxide product remains unaffected.

Figures 12A, 12B:
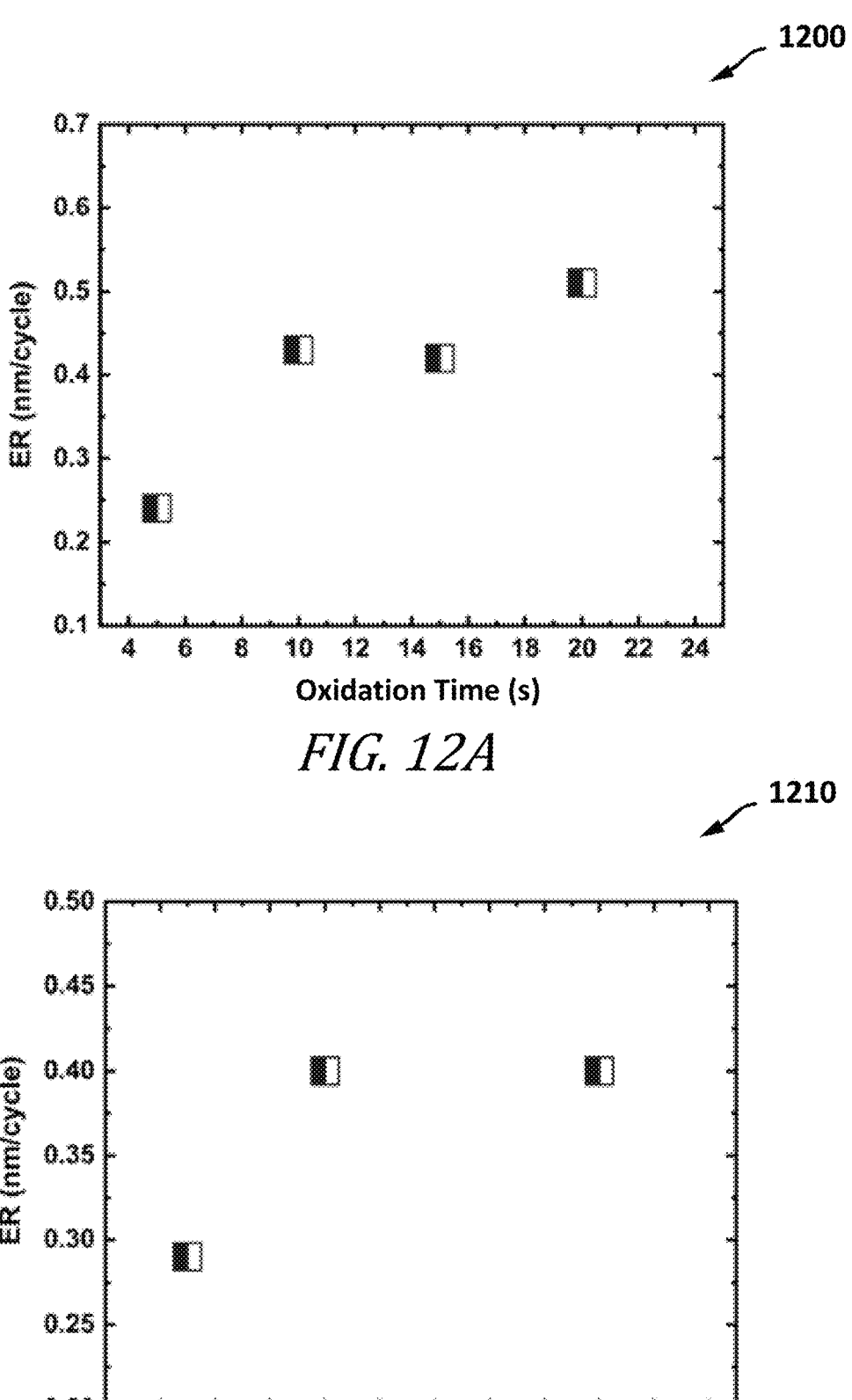
FIG. 12A is a graph depicting exemplary etch rates (expressed in nm/cycle) achieved as a function of oxidation time (expressed in seconds, s) when using a 1% APS+500 mM $(NH_4)_2EDTA$-DIW solution to oxidize the molybdenum surface in the wet ALE process shown in FIG. 2.
FIG. 12B is a graph depicting exemplary etch rate (expressed in nm/cycle) achieved as a function of dissolution time (expressed in seconds, s) when using a 5 mM $NH_4OH$+

Additional etch experiments were performed to investigate the effect of oxidation time and dissolution time on the Mo etch rate when higher APS concentration is used to oxidize the molybdenum surface. The graph 1200 shown in FIG. 12A depicts exemplary etch rates (expressed in nm/cycle) achieved as a function of oxidation time (expressed in seconds, s) when the molybdenum surface is etched by dipping the Mo coupon in 1% APS+500 mM of $(NH_4)_2EDTA$ in DIW at 40° C. for various oxidation times, followed by dissolution of the oxidized surface by dipping the Mo coupon in 5 mM $NH_4OH$+10 mM AA solution for 10 seconds. As shown in the graph 1200, the Mo surface oxide saturation is not complete at 5 seconds. A constant Mo etch rate (~0.43 nm/cycle) between 10-15 seconds of oxidation time indicates the existence of a small ALE window (~5 seconds). A higher Mo etch rate (~0.51 nm/cycle) at 20 seconds of oxidation time indicates the breakdown of the ALE window. The graph 1210 shown in FIG. 12B depicts exemplary etch rates (expressed in nm/cycle) achieved as a function of dissolution time (expressed in seconds, s) when the molybdenum surface is etched by dipping the Mo coupon in 5 mM $NH_4OH$+10 mM AA solution after oxidizing the molybdenum coupon in 1% APS+500 mM of $(NH_4)_2EDTA$ in DIW at 40° C. for 10 seconds. As shown in the graph 1210, a Mo etch rate ~0.28 nm/cycle at 5 seconds of dissolution time indicates that the dissolution of modified layer is not complete. However, increasing the dissolution time to 10 seconds increases the Mo etch rate to ~0.40 nm/cycle, which remains constant up to about 20 seconds. A constant Mo etch rate in between 10-20 seconds of dissolution time indicates that the dissolution of the modified layer is complete and shows self-limiting behavior.

The graph 1300 shown in FIG. 13 depicts exemplary etch amounts (expressed in nanometers, nm) achieved as a function of oxidation time (expressed in minutes, min) when using two different aqueous oxidizing solutions containing various concentrations of APS and $(NH_4)_2EDTA$ in DIW. To obtain the results shown in the graph 1300, the surface of the Mo coupon was exposed to various surface modification solutions for variable lengths of time (e.g., 0-10 minutes) to oxidize the molybdenum surface and form a molybdenum oxide passivation layer. Specifically, the molybdenum surface was exposed to 0.2% APS+200 mM $(NH_4)_2EDTA$ in DIW and 1% APS+500 mM $(NH_4)_2EDTA$ in DIW. After performing the surface modification and rinsing with DIW/ methanol, the change in film resistivity was measured using the 4 pp measurements method. The graph 1300 shows a delayed Mo background etch in the aqueous oxidizing solution with higher APS/EDTA concentration solution, which suggests a quasi-self-limiting oxidation process.

AFM measurements were carried out to study the evolution of surface roughness in post etch Mo coupon. FIG. 14 shows 5 μm×5 μm AFM images of as-deposited Mo coupons and post-etch Mo coupons etched using various concentrations of $(NH_4)_2EDTA$ in a 1% APS-$(NH_4)_2EDTA$-DIW solution. RMS roughness data shows increased surface roughness when the Mo coupon is oxidized in 1% APS+250 mM $(NH_4)_2EDTA$ solution. However, increasing the $(NH_4)_2EDTA$ concentration to 500 mM preserves the surface smoothness up to about 8 nm. The preserved post-etch surface morphology may be attributed to the 500 mM $(NH_4)_2EDTA$ preventing continuous Mo etch in the 1% APS-DIW solution by forming a stable ligand-metal oxide complex that is insoluble in aqueous oxidizing solution.

The wet ALE process shown in FIG. 2 provides new wet etch chemistries and techniques for etching a molybdenum layer using an aqueous oxidizing solution. In the wet ALE process shown in FIG. 2, ligand-assisted oxidation is used in the surface modification step to change the surface chemistry of the molybdenum oxide passivation layer and ensure self-limiting oxidation behavior.

As shown in the etching experiments above, oxidation of the molybdenum layer is not self-limiting in an aqueous oxidizing solution without the addition of a ligand. As shown in FIG. 3, the addition of a bidentate ligand (oxalic acid) to the aqueous oxidizing solution suppresses the etch amount by creating a relatively stable, ligand-metal oxide surface complex, which changes the solubility rate of surface oxide product (e.g., $MoO_3$) but does not result in self-limiting oxidation behavior. However, FIG. 3 further shows adding a hexadentate ligand (($NH_4)_2EDTA$) to the aqueous oxidizing solution increases the stability of the ligand-metal oxide surface complex, renders the surface oxide product insoluble in the aqueous oxidizing solution and provides self-limiting oxidation behavior.

Although a hexadentate ligand (($NH_4)_2EDTA$) is utilized in the etching experiments to form a self-limiting molybdenum oxide passivation layer in an aqueous oxidizing solution, it is possible that other polydentate ligands having two or more donor atoms could alternatively be used for the same purpose. Since the stability of the ligand-metal oxide surface complex in aqueous solution generally increases with increasing number of donor atoms, polydentate ligands having more than two donor atoms (e.g., tridentate ligands, tetradentate ligands, pentadentate ligands, hexadentate ligands, etc.) may generally be preferred.

The etching experiments further show that the concentrations of the oxidizer (e.g., APS) and polydentate ligand (e.g., $(NH_4)_2EDTA$) used within the aqueous oxidizing solution, as well as the oxidation time and temperature, can be tuned to control the etch rate of the molybdenum layer and provide self-limiting oxidation behavior within a small ALE window, while preserving post-etch surface roughness. Specifically, FIGS. 5 and 11 show the Mo etch rate increases with increasing APS concentration (e.g., 0.2% APS to 1% APS) and oxidation temperature. However, FIGS. 8A-8B and FIGS. 12A-12B show that adding 200 mM to 500 mM of $(NH_4)_2EDTA$ to the aqueous oxidizing solution provides self-limiting oxidation behavior within a small ALE window. The post-etch surface roughness of the molybdenum layer also increases with increasing APS concentration. However, FIGS. 9, 10 and 14 show that the post-etch surface roughness of the molybdenum layer can be preserved by: (a) the addition of $(NH_4)_2EDTA$ in the APS-DIW solution forming a stable ligand-metal oxide complex that is insoluble in the aqueous oxidizing solution, and/or (b) the addition of ascorbic acid in the $NH_4OH$ solution, which prevents oxidative damage to the Mo surface via radical scavenging.

FIG. 15 illustrates another embodiment of a method 1500 that can be used for etching a substrate using a wet atomic layer etching (ALE) process. More specifically, FIG. 15 illustrates a method 1500 that can be used to etch a substrate having a molybdenum (Mo) layer formed thereon using a wet ALE process, which utilizes ligand-assisted oxidation to oxidize the molybdenum surface. It will be recognized that the embodiment of FIG. 15 is merely exemplary and additional methods may utilize the wet ALE techniques described herein. Further, additional processing steps may be added to the method shown in the FIG. 15 as the steps described are not intended to be exclusive. Moreover, the order of the steps is not limited to the order shown in the figures as different orders may occur and/or various steps may be performed in combination or at the same time.

The method 1500 shown in FIG. 15 begins by receiving the substrate, the substrate having a molybdenum (Mo) layer formed thereon, wherein a molybdenum surface is exposed on a surface of the substrate (in step 1510). Then, in step 1520, the method 1500 includes selectively etching the molybdenum layer by performing multiple cycles of the wet ALE process, wherein each cycle comprises: (a) exposing the molybdenum surface to a first etch solution comprising an oxidizer and a polydentate ligand dissolved in an aqueous solvent to form a chemically modified Mo surface layer that is self-limiting and insoluble in the non-aqueous solvent; (b) rinsing the substrate with a first purge solution to remove the first etch solution from the surface of the substrate; (c) exposing the chemically modified Mo surface layer to a second etch solution to dissolve the chemically modified Mo surface layer; and (d) rinsing the substrate with a second purge solution to remove the second etch solution from the surface of the substrate.

In the method 1500, the oxidizer included within the first etch solution reacts with the molybdenum surface to oxidize the molybdenum surface and form the chemically modified Mo surface layer. The polydentate ligand included within the first etch solution reacts with and binds to the chemically modified Mo surface layer to change a surface chemistry of the chemically modified Mo surface layer. Changing the surface chemistry ensures that the chemically modified Mo surface layer is self-limiting and insoluble in the aqueous solvent. A wide variety of oxidizers and polydentate ligands may be utilized in the first etch solution, as described above in reference to FIGS. 1 and 2.

In one example embodiment, the first etch solution may include APS (as the oxidizer) and a hexadentate ligand (e.g., $(NH_4)_2EDTA$) in deionized water. However, other oxidizers and polydentate ligands may also be used in the first etch solution to provide the ligand-assisted oxidation of the molybdenum surface, which renders the chemically modified Mo surface layer insoluble in the aqueous solvent and ensures self-limiting oxidation behavior. Although insoluble in the aqueous solvent used in the first etch solution, the chemically modified Mo surface layer is soluble within the second etch solution. In one example embodiment, the second etch solution may include a reactive agent (such as an acid or a base) and a ligand (e.g., a carboxylic acid or a ligand containing an ascorbate anion or amine) dissolved in aqueous solvent. For example, the second etch solution may include ammonium hydroxide ($NH_4OH$) and ascorbic acid to provide ligand-assisted dissolution of the chemically modified Mo surface layer. However, other bases, acids and/or ligands may also be used in the second etch solution to selectively dissolve the chemically modified Mo surface layer without removing the unmodified Mo surface underlying the chemically modified Mo surface layer.

The wet ALE processes described above and shown in FIG. 2 for etching molybdenum can be accomplished using a variety of techniques. For example, the molybdenum wet ALE processes disclosed above may be performed by dipping the molybdenum sample in beakers of each etch solution. In this case, purging can be accomplished by either rinsing or dipping the sample in an appropriate solvent bath. The molybdenum wet ALE processes can also be accomplished on a spinner. For example, the molybdenum sample may be rotated while the etchant solutions are dispensed from a nozzle positioned above the sample. The rotational motion of the sample distributes the solution over the surface. After the set exposure time, the nozzle begins dispensing the next solution in the etch recipe. This process continues through the whole etch cycle and repeats for as many cycles as necessary to remove the desired amount of metal. For high volume manufacturing, dispensing of etch solutions and rinses can be executed using conventional tools, such as wet etching tools and rinse tools.

Example process conditions (e.g., etch chemistry, temperature, processing time, etc.) are provided herein for etching transition metals, and more specifically, for etching molybdenum using the wet ALE processes described above and shown in FIG. 2. It will be recognized by those skilled in the art, however, that the wet ALE processes disclosed herein are not strictly limited to the example process conditions described herein and may be performed using a wide variety of process conditions depending on the material being etched.

FIG. 16 illustrates one embodiment of a processing system 1600 that can etch a transition metal surface, such as a molybdenum surface, on a surface of a substrate 1630 using the wet ALE processes disclosed herein. As shown in FIG. 16, the processing system 1600 includes a process chamber 1610, which in some embodiments, may be a pressure controlled chamber. In the embodiment shown in FIG. 16, the process chamber 1610 is a spin chamber having a spinner 1620 (or spin chuck), which is configured to spin or rotate at a rotational speed. A substrate 1630 is held on the spinner 1620, for example, via electrostatic force or vacuum pressure. In one example, the substrate 1630 may be a semiconductor wafer having a transition metal, such as molybdenum, formed on or within the substrate 1630.

The processing system 1600 shown in FIG. 16 further includes a liquid nozzle 1640, which is positioned over the substrate 1630 for dispensing various etch solutions 1642 onto a surface of the substrate 1630. The etch solutions 1642 dispensed onto the surface of the substrate 1630 may generally include a surface modification solution to chemically modify the molybdenum surface and form a modified surface layer (e.g., a molybdenum oxide passivation layer), and a dissolution solution to selectively remove the modified surface layer from the molybdenum surface. Purge solutions may also be dispensed onto the surface of the substrate 1630 between surface modification and dissolution steps to separate the surface modification and dissolution solutions. Examples of surface modification, dissolution and purge solutions are discussed above.

As shown in FIG. 16, the etch solutions 1642 may be stored within a chemical supply system 1646, which may include one or more reservoirs for holding the various etch solutions 1642 and a chemical injection manifold, which is fluidly coupled to the process chamber 1610 via a liquid supply line 1644. In operation, the chemical supply system 1646 may selectively apply desired chemicals to the process chamber 1610 via the liquid supply line 1644 and the liquid nozzle 1640 positioned within the process chamber 1610. Thus, the chemical supply system 1646 can be used to dispense the etch solutions 1642 onto the surface of the substrate 1630. The process chamber 1610 may further include a drain 1650 for removing the etch solutions 1642 from the process chamber 1610.

Components of the processing system 1600 can be coupled to, and controlled by, a controller 1660, which in turn, can be coupled to a corresponding memory storage unit and user interface (not shown). Various processing operations can be executed via the user interface, and various processing recipes and operations can be stored in the memory storage unit. Accordingly, a given substrate 1630 can be processed within the process chamber 1610 in accordance with a particular recipe. In some embodiments, a given substrate 1630 can be processed within the process chamber 1610 in accordance with an etch recipe that utilizes the wet ALE techniques described herein for etching molybdenum.

The controller 1660 shown in block diagram form in FIG. 16 can be implemented in a wide variety of manners. In one example, the controller 1660 may be a computer. In another example, the controller 1660 may include one or more programmable integrated circuits that are programmed to provide the functionality described herein. For example, one or more processors (e.g., microprocessor, microcontroller, central processing unit, etc.), programmable logic devices (e.g., complex programmable logic device (CPLD), field programmable gate array (FPGA), etc.), and/or other programmable integrated circuits can be programmed with software or other programming instructions to implement the functionality of a prescribed process recipe. It is further noted that the software or other programming instructions can be stored in one or more non-transitory computer-readable mediums (e.g., memory storage devices, flash memory, dynamic random access memory (DRAM), reprogrammable storage devices, hard drives, floppy disks, DVDs, CD-ROMs, etc.), and the software or other programming instructions when executed by the programmable integrated circuits cause the programmable integrated circuits to perform the processes, functions, and/or capabilities described herein. Other variations could also be implemented.

As shown in FIG. 16, the controller 1660 may be coupled to various components of the processing system 1600 to receive inputs from, and provide outputs to, the components. For example, the controller 1660 may be coupled to: the process chamber 1610 for controlling the temperature and/or pressure within the process chamber 1610; the spinner 1620 for controlling the rotational speed of the spinner 1620; and the chemical supply system 1646 for controlling the various etch solutions 1642 dispensed onto the substrate 1630. The controller 1660 may control other processing system components not shown in FIG. 16, as is known in the art.

In some embodiments, the controller 1660 may control the various components of the processing system 1600 in accordance with an etch recipe that utilizes the wet ALE techniques described herein for etching molybdenum (Mo). For example, the controller 1660 may supply various control signals to the chemical supply system 1646, which cause the chemical supply system 1646 to: a) dispense a surface modification solution onto the surface of the substrate 1630 to chemically modify exposed surfaces of the molybdenum and create a chemically modified Mo surface layer (e.g., a molybdenum oxide passivation layer) on the substrate 1630; b) rinse the substrate 1630 with a first purge solution to remove the surface modification solution and excess reactants from the surface; c) dispense a dissolution solution onto the surface of the substrate 1630 to selectively remove or dissolve the chemically modified Mo surface layer; and d) rinse the substrate with a second purge solution to remove the dissolution solution from the surface of the substrate 1630. In some embodiments, the controller 1660 may supply the control signals to the chemical supply system 1646 in a cyclic manner, such that the steps a)-d) are repeated for one or more ALE cycles, until a desired amount of the molybdenum has been removed.

The controller 1660 may also supply control signals to other processing system components. In some embodiments, for example, the controller 1660 may supply control signals to the spinner 1620 and/or the chemical supply system 1646 to dry the substrate 1630 after the second purge step is performed. In one example, the controller 1660 may control the rotational speed of the spinner 1620, so as to dry the substrate 1630 in a spin dry step. In another example, control signals supplied from the controller 1660 to the chemical supply system 1646 may cause a drying agent (such as, e.g., isopropyl alcohol) to be dispensed onto the surface of the substrate 1630 to further assist in drying the substrate before performing the spin dry step.

In some embodiments, the controller 1660 may control the temperature and/or the pressure within the process chamber 1610. In some embodiments, the surface modification, dissolution and purge steps of the molybdenum wet ALE processes described herein may be performed at roughly the same temperature and pressure. In one example implementation, the surface modification, dissolution and purge steps may each be performed at (or near) atmospheric pressure and room temperature. Performing the processing steps within the same process chamber at roughly the same temperature and pressure decreases the cycle time and improves the throughput of the wet ALE process described herein by avoiding unnecessary chamber transitions and temperature/pressure changes.

It is noted, however, that the embodiments described herein are not strictly limited to only atmospheric pressure and room temperature, nor are they limited to a particular process chamber. In other embodiments, one or more of the surface modification, dissolution and purge steps can be run at above atmospheric pressure in a pressure vessel, or at reduced pressure in a vacuum chamber. Etch solutions can be dispensed in these environments as long as the vapor pressure of the liquid is lower than the chamber pressure. For these implementations, a spinner with a liquid dispensing nozzle would be placed in the pressure vessel or vacuum chamber. The temperature of the liquid being dispensed can be elevated to any temperature below its boiling point at the pressure of the process. In one example implementation, the dissolution step may be performed at an elevated temperature (for example, at about 40° C.) to increase the kinetics of dissolution.

The present disclosure provides systems and methods that utilize new etch chemistries for etching molybdenum (Mo) in a wet ALE process. As described above, the wet ALE processes and methods disclosed herein use a wide variety of etch chemistries to oxidize a molybdenum layer exposed on a surface of a substrate and form a self-limiting, molybdenum oxide passivation layer (e.g., molybdenum oxide passivation layer) in a surface modification step of the wet ALE process. For example, the wet ALE processes and methods disclosed herein may use ligand-assisted oxidation to change the surface chemistry of the molybdenum oxide passivation layer and ensure self-limiting oxidation behavior in an aqueous oxidizing solution. Unlike conventional methods and chemistries used for etching molybdenum, the new wet etch chemistries and methods described herein may be used, alone or in combination, to improve the oxidation behavior of the molybdenum surface in the surface modification step and/or provide a molybdenum oxide passivation layer, which is self-limiting and insoluble in the aqueous oxidizing solution. Although described herein for etching molybdenum, the techniques described herein may also be used for etching other transition metals such as, but not limited to, cobalt (Co), copper (Cu), tungsten (W), vanadium (V), niobium (Nb), tantalum (Ta), titanium (Ti), chromium (Cr) and nickel (Ni).

The term "substrate" as used herein means and includes a base material or construction upon which materials are formed. It will be appreciated that the substrate may include a single material, a plurality of layers of different materials, a layer or layers having regions of different materials or different structures in them, etc. These materials may include semiconductors, insulators, conductors, or combinations thereof. For example, the substrate may be a semiconductor substrate, a base semiconductor layer on a supporting structure, a metal electrode or a semiconductor substrate having one or more layers, structures or regions formed thereon. The substrate may be a conventional silicon substrate or other bulk substrate comprising a layer of semi-conductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

The substrate may also include any material portion or structure of a device, particularly a semiconductor or other electronics device, and may, for example, be a base substrate structure, such as a semiconductor substrate or a layer on or overlying a base substrate structure. Thus, the term "substrate" is not intended to be limited to any particular base structure, underlying layer or overlying layer, patterned layer or unpatterned layer, but rather, is contemplated to include any such layer or base structure, and any combination of layers and/or base structures.

It is noted that reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

One skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Further modifications and alternative embodiments of the methods described herein will be apparent to those skilled in the art in view of this description. It will be recognized, therefore, that the described methods are not limited by these example arrangements. It is to be understood that the forms of the methods herein shown and described are to be taken as example embodiments. Various changes may be made in the implementations. Thus, although the inventions are described herein with reference to specific embodiments, various modifications and changes can be made without departing from the scope of the present inventions. Accordingly, the specification and figures are to be regarded in an illustrative rather than a restrictive sense, and such modifications are intended to be included within the scope of the present inventions. Further, any benefits, advantages, or solutions to problems that are described herein with regard to specific embodiments are not intended to be construed as a critical, required, or essential feature or element of any or all the claims.

What is claimed is:

1. A method of etching, the method comprising:
receiving a substrate having a molybdenum (Mo) layer formed thereon, wherein a molybdenum surface is exposed on a surface of the substrate;
exposing the surface of the substrate to a surface modification solution comprising an oxidizer and a polydentate ligand dissolved in an aqueous solvent, wherein the oxidizer reacts with the molybdenum surface to oxidize the molybdenum surface and form a molybdenum oxide passivation layer, and wherein the polydentate ligand binds to the molybdenum oxide passivation layer to form a surface species that is insoluble in the aqueous solvent;
removing the surface modification solution from the surface of the substrate subsequent to forming the molybdenum oxide passivation layer;
exposing the surface of the substrate to a dissolution solution to selectively remove the molybdenum oxide passivation layer, wherein the dissolution solution reacts with the molybdenum oxide passivation layer to form soluble species that are dissolved by the dissolution solution; and
removing the dissolution solution and the soluble species from the surface of the substrate to etch the molybdenum layer.

2. The method of claim 1, further comprising repeating said exposing the surface of the substrate to the surface modification solution, removing the surface modification solution, exposing the surface of the substrate to the dissolution solution, and removing the dissolution solution and the soluble species a number of times until a predetermined amount of the molybdenum layer is removed from the substrate.

3. The method of claim 1, wherein the polydentate ligand reacts with and binds to the molybdenum oxide passivation layer to change a surface chemistry of the molybdenum oxide passivation layer, and wherein changing the surface chemistry ensures that the molybdenum oxide passivation layer is self-limiting and insoluble in the aqueous solvent.

4. The method of claim 1, wherein the polydentate ligand is a bidentate ligand, a tridentate ligand, a tetradentate ligand, a pentadentate ligand or a hexadentate ligand.

5. The method of claim 1, wherein the polydentate ligand is oxalic acid, acetic acid, ascorbic acid, mandelic acid, malic acid, maleic acid, fumaric acid, ethylenediamine, acetylacetonate ion, diethylenetriamine, terpyridine, diaminopyridine, pentamethyl diethylenetriamine, triethylenetetramine, nitrilotriacetate, tetraethylenepentamine, ethylenediaminetetraacetic acid (EDTA) or a diammonium salt of EDTA [(NH$_4$)$_2$EDTA].

6. The method of claim 1, wherein the polydentate ligand reacts with and binds to the molybdenum oxide passivation layer to form a ligand-metal oxide complex that is insoluble in the aqueous solvent.

7. The method of claim 6, wherein the polydentate ligand has more than two donor atoms to increase a stability of the ligand-metal oxide complex and render the molybdenum oxide passivation layer insoluble in the aqueous solvent.

8. The method of claim 6, wherein the polydentate ligand is a tridentate ligand, a tetradentate ligand, a pentadentate ligand or a hexadentate ligand.

9. The method of claim 6, wherein the polydentate ligand is ethylenediamine, acetylacetonate ion, diethylenetriamine, terpyridine, diaminopyridine, pentamethyl diethylenetriamine, triethylenetetramine, nitrilotriacetate, tetraethylenepentamine, ethylenediaminetetraacetic acid (EDTA) or a diammonium salt of EDTA [(NH$_4$)$_2$EDTA].

10. The method of claim 1, wherein the polydentate ligand is a hexadentate ligand.

11. The method of claim 1, wherein the polydentate ligand is ethylenediaminetetraacetic acid (EDTA) or a diammonium salt of EDTA [(NH$_4$)$_2$EDTA].

12. The method of claim 1, wherein the oxidizer comprises ammonium persulfate (APS), ferric chloride (FeCl$_3$), an osmium tetroxide, a ruthenium tetroxide, a ruthenate, a manganate, a permanganate, a periodate, a metal nitrate, hydrogen peroxide (H$_2$O$_2$), or another peroxide.

13. The method of claim 1, wherein the oxidizer comprises ammonium persulfate (APS), and wherein the polydentate ligand comprises ethylenediaminetetraacetic acid (EDTA) or a diammonium salt of EDTA [(NH$_4$)$_2$EDTA].

14. The method of claim 1, wherein the dissolution solution is: (a) an aqueous acidic solution comprising hydrochloric acid (HCl), nitric acid or sulfuric acid, (b) an aqueous basic solution comprising ammonium hydroxide (NH$_4$OH), tetramethylammonium hydroxide (TMAH), potassium hydroxide (KOH) or calcium hydroxide (Ca(OH)$_2$), (c) a non-aqueous ligand solution comprising alpha-benzoin oxime in acetone, dimethyl sulfoxide (DMSO), methyl-ethyl ketone (MEK) or another ketone, or (d) an aqueous ligand solution comprising a base and a ligand.

15. The method of claim 1, wherein the dissolution solution is an aqueous ligand solution comprising ammonium hydroxide (NH$_4$OH) and a ligand.

16. The method of claim 15, wherein the ligand is ascorbic acid, sodium ascorbate, calcium ascorbate, potassium ascorbate, oxalic acid, formic acid, acetic acid, ethylenediamine, ethylenediaminetetraacetic acid (EDTA) or iminodiacetic acid.

17. A method of etching a substrate using a wet atomic layer etching (ALE) process, the method comprising:

receiving the substrate, the substrate having a molybdenum (Mo) layer formed thereon, wherein a molybdenum surface is exposed on a surface of the substrate; and selectively etching the molybdenum layer by performing multiple cycles of the wet ALE process, wherein each cycle comprises:

exposing the molybdenum surface to a first etch solution comprising an oxidizer and a polydentate ligand dissolved in an aqueous solvent to form a chemically modified Mo surface layer that is self-limiting and insoluble in the aqueous solvent;

rinsing the substrate with a first purge solution to remove the first etch solution from the surface of the substrate;

exposing the chemically modified Mo surface layer to a second etch solution to dissolve the chemically modified Mo surface layer; and rinsing the substrate with a second purge solution to remove the second etch solution from the surface of the substrate.

18. The method of claim 17, wherein the oxidizer reacts with the molybdenum surface to oxidize the molybdenum surface and form the chemically modified Mo surface layer, wherein the polydentate ligand reacts with and binds to the chemically modified Mo surface layer to change a surface chemistry of the chemically modified Mo surface layer, and wherein changing the surface chemistry ensures that the chemically modified Mo surface layer is self-limiting and insoluble in the aqueous solvent.

19. The method of claim 17, wherein the oxidizer comprises ammonium persulfate (APS), ferric chloride (FeCl3), an osmium tetroxide, a ruthenium tetroxide, a ruthenate, a manganate, a permanganate, a periodate, a metal nitrate, hydrogen peroxide (H$_2$O$_2$), or another peroxide.

20. The method of claim 17, wherein the polydentate ligand is a bidentate ligand, a tridentate ligand, a tetradentate ligand, a pentadentate ligand or a hexadentate ligand.

21. The method of claim 17, wherein the polydentate ligand is oxalic acid, acetic acid, ascorbic acid, mandelic acid, malic acid, maleic acid, fumaric acid, ethylenediamine, acetylacetonate ion, diethylenetriamine, terpyridine, diaminopyridine, pentamethyl diethylenetriamine, triethylenetetramine, nitrilotriacetate, tetraethylenepentamine, ethylenediaminetetraacetic acid (EDTA) or a diammonium salt of EDTA [(NH$_4$)$_2$EDTA].

22. The method of claim 17, wherein the first etch solution comprises ammonium persulfate (APS) and a hexadentate ligand dissolved in water.

23. The method of claim 17, wherein the second etch solution is an aqueous ligand solution comprising ammonium hydroxide (NH$_4$OH) and a ligand.

24. The method of claim 23, wherein the ligand is ascorbic acid, sodium ascorbate, calcium ascorbate, potassium ascorbate, oxalic acid, formic acid, acetic acid, ethylenediamine, ethylenediaminetetraacetic acid (EDTA) or iminodiacetic acid.

* * * * *